(12) United States Patent
Oi

(10) Patent No.: US 7,768,140 B2
(45) Date of Patent: Aug. 3, 2010

(54) SEMICONDUCTOR DEVICE

(75) Inventor: Kiyoshi Oi, Nagano (JP)

(73) Assignee: Shinko Electric Industries Co., Ltd., Nagano-shi (JP)

( * ) Notice: Subject to any disclaimer, the term of this patent is extended or adjusted under 35 U.S.C. 154(b) by 121 days.

(21) Appl. No.: 11/860,855

(22) Filed: Sep. 25, 2007

(65) Prior Publication Data

US 2008/0251944 A1 Oct. 16, 2008

(30) Foreign Application Priority Data

Oct. 3, 2006 (JP) ............................. 2006-272183

(51) Int. Cl.
*H01L 29/72* (2006.01)
(52) U.S. Cl. .................. 257/790; 257/773; 257/778; 257/788
(58) Field of Classification Search ................ 257/773, 257/778, 788, 790
See application file for complete search history.

(56) References Cited

U.S. PATENT DOCUMENTS 6,359,308 B1 * 3/2002 Hijzen et al. ............... 257/341
6,521,480 B1 * 2/2003 Mitchell et al. ............. 438/108
2002/0190377 A1 * 12/2002 Igarashi et al. .............. 257/738
2003/0133274 A1 * 7/2003 Chen et al. .................. 361/760
2006/0163631 A1 * 7/2006 Chen et al. .................. 257/296

FOREIGN PATENT DOCUMENTS

JP          11-265967        9/1999

* cited by examiner

*Primary Examiner*—Edward Wojciechowicz
(74) *Attorney, Agent, or Firm*—Rankin, Hill & Clark LLP

(57) ABSTRACT

A semiconductor device has a semiconductor chip bonded to external connection pads or external connection terminals by flip-chip bonding and an underfill resin, and provides a semiconductor device which enables to lessen the warpage attributable to the underfill without involvement of an increase in the size of the semiconductor device. A low elastic resin member is disposed opposite to a surface of a semiconductor chip on which a plurality of electrode pads are formed, and an underfill resin is filled between the semiconductor chip and the low elastic resin member and between electrode pads and external connection pads.

11 Claims, 36 Drawing Sheets

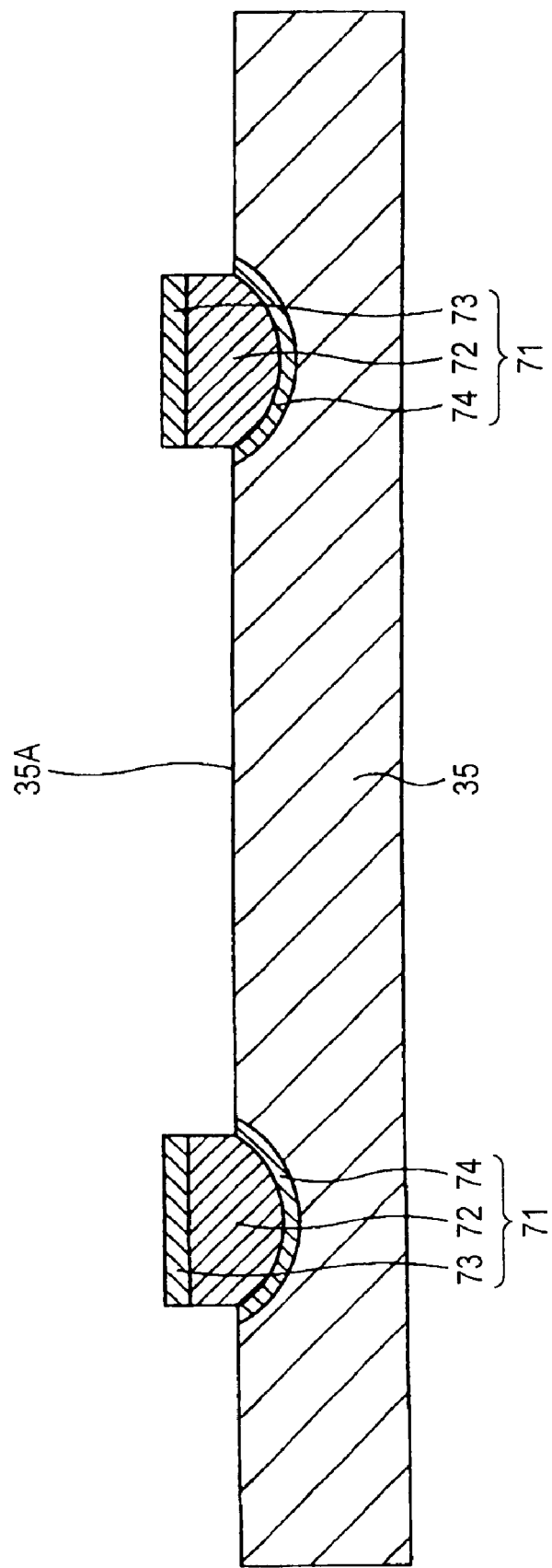

SEMICONDUCTOR DEVICE

This application is based on and claims priority from Japanese Patent Application No. 2006-272183, filed on Oct. 3, 2006, the entire contents of which are hereby incorporated by reference.

BACKGROUND OF THE INVENTION

1. Technical Field

The present disclosure relates to a semiconductor device and, more particularly, to a semiconductor device having a semiconductor chip bonded to an external connection pad by flip-chip bonding and an underfill resin.

2. Background Art

FIG. 1 is a cross sectional view of a related-art semiconductor device. In FIG. 1, reference symbol L designates a distance (hereinafter described as "distance J") between an upper surface 106A of a substrate 106 and a semiconductor chip 102.

By reference to FIG. 1, a related-art semiconductor device 100 has a wiring board 101, the semiconductor chip 102, and an underfill resin 103. The wiring board 101 has the substrate 106 in which a through hole 107 is formed; a through via 108 formed in the through hole 107; a wiring 109 provided on the upper surface 106A of the substrate 106; and a wiring 111 provided on a lower surface 106B of the substrate 106. The wiring 109 is electrically connected to the wiring 111 by the through via 108.

The semiconductor chip 102 has a plurality of electrode pads 113. Each of the plural electrode pads 113 is provided with an internal connection terminal 114 (specifically, e.g., a bump). The electrode pad 113 is electrically connected to the wiring 109 by the internal connection terminal 114. In other words, the semiconductor chip 102 is bonded to the wiring 109 by flip-chip bonding. The distance J between the semiconductor chip 102 and the substrate 106 may be set to 50 µm, for example.

The underfill resin 103 is provided so as to fill a gap between the wiring board 101 and the semiconductor chip 102. The underfill resin 103 is a resin for reinforcing a connection between the electrode pads 113, the wiring 109, and the internal connection terminals 114. The thickness of the underfill resin 103 sandwiched between the substrate 106 and the semiconductor chip 102 may be set to 50 µm, for example.

In the related-art semiconductor device 100 configured as mentioned above, when the thickness of the semiconductor chip 102 and/or the thickness of the substrate 106 are reduced, there arises a problem of warpage occurring in the semiconductor device 100 under the influence of stress of the underfill resin 103. For example, a semiconductor device shown in FIG. 2 is available as a semiconductor device that solves such a problem.

FIG. 2 is a cross sectional view of another related-art semiconductor device. In FIG. 2, constituent elements which are the same as those of the semiconductor device 100 shown in FIG. 1 are assigned the same reference numerals.

By reference to FIG. 2, a related-art semiconductor device 120 has a wiring board 121, semiconductor chips 102 and 125, and the underfill resin 103. The wiring board 121 has a substrate 122, a wiring 123 provided on an upper surface 122A of the substrate 122, and a wiring 124 provided on a lower surface 122B of the substrate 122.

The semiconductor chip 102 is electrically connected to the wiring 123 by internal connection terminals 114 provided on the respective electrode pads 113. The semiconductor chip 102 is bonded to the wiring 123 by flip-chip bonding.

A semiconductor chip 125 has a plurality of electrode pads 126. The plurality of electrode pads 126 has the internal connection terminals 114 (specifically, e.g., bumps), respectively. The electrode pads 126 are electrically connected to the wiring 124 by the internal connection terminals 114. The semiconductor chip 125 is bonded to the wiring 124 by flip-chip bonding.

The underfill resin 103 is provided so as to fill a gap between the upper surface of the wiring board 121 and the semiconductor chip 102 and a gap between the lower surface of the wiring board 121 and the semiconductor chip 125.

As mentioned above, the two semiconductor chips 102 and 125 are arranged opposite to each other with the substrate 122 sandwiched therebetween. The underfill resin 103 is provided between the wiring board 121 and the semiconductor chip 102 and between the wiring board 121 and the semiconductor chip 125. The underfill resin 103 provided on both surfaces of the wiring board 121 are made essentially equal in thickness to each other, thereby canceling the stress of the underfill resin 103 provided on both surfaces of the wiring board 121. Therefore, warpage of the semiconductor substrate 120 attributable to the underfill resin 103 can be diminished (see e.g., Japanese Patent Unexamined Document: JP-A-11-265967).

However, the related-art semiconductor device 120 enables a reduction in the warpage of the semiconductor device 120 attributable to the underfill resin 103. However, since the semiconductor chips 102 and 125 are provided on both surfaces of the wiring board 121, there arises a problem of an increase in the size of the semiconductor device 120.

SUMMARY OF THE INVENTION

Exemplary embodiments of the present invention provide a semiconductor device that enables a decrease in the degree of warpage attributable to an underfill resin.

According to one or more aspects of the present invention, there is provided a semiconductor device comprising:

a semiconductor chip having a plurality of electrode pads;

internal connection terminals provided on the plurality of electrode pads;

external connection pads electrically connected to the electrode pads through the internal connection terminals;

a low elastic resin member disposed opposite to a surface of the semiconductor chip on which the plurality of electrode pads are formed; and an underfill resin filled between the semiconductor chip and the low elastic resin member and between the electrode pads and the external connection pads, wherein the low elastic resin member has a lower elastic modulus than the underfill resin, wherein first distance between the semiconductor chip and the low elastic resin member is narrower than second distance between the electrode pads and the external connection pads.

According to one or more aspects of the present invention, the first distance between the semiconductor chip and the low elastic resin member is narrower than second distance between the respective electrode pads and the respective external connection pads, so that the thickness of the underfill resin sandwiched between the semiconductor chip and the low elastic resin member can be reduced compared with the thickness of a related-art underfill resin. Hence, warpage of a semiconductor device attributable to the underfill resin can be reduced.

The low elastic resin member is provided on the semiconductor chip by the underfill resin. As a result, the low elastic resin member lessens stress stemming from curing and shrinkage of the underfill resin and stress caused by a difference between the thermal expansion coefficient of the semiconductor chip and the thermal expansion coefficient of the underfill resin. Hence, warpage of the semiconductor device can be diminished.

According to another aspect of the present invention, there is provided a semiconductor device comprising:

a semiconductor chip having a plurality of electrode pads;

internal connection terminals provided on the plurality of electrode pads;

external connection pads electrically connected to the electrode pads through the internal connection terminals;

a low elastic resin member provided on a surface of the semiconductor chip on which the plurality of electrode pads are formed; and an underfill resin filled between the electrode pads and the external connection pads, wherein the low elastic resin member has a lower elastic modulus than the underfill resin.

According to another aspect of the present invention, the low elastic resin member is provided on a surface of the semiconductor chip on which the plurality of electrode pads are formed. Hence, the underfill resin does not exist between the low elastic resin member and the surface of the semiconductor chip on which the plurality of electrode pads are formed. Hence, warpage of the semiconductor device attributable to the underfill resin can be diminished.

Further, when stress has arisen for reasons of a difference between the semiconductor chip and the underfill resin in terms of an elastic modulus, a thermal expansion coefficient, or the like, the low elastic resin member can lessen the stress. Hence, warpage of the semiconductor device can be reduced.

According to the present invention, there can be reduced the warpage of a semiconductor device attributable to an underfill resin without involvement of an increase in the size of the semiconductor device.

BRIEF DESCRIPTION OF THE DRAWINGS

FIG. 36 is a view showing a fourth process step for fabricating the semiconductor device of the fifth exemplary embodiment of the present invention.

DETAILED DESCRIPTION OF EXEMPLARY EMBODIMENTS

Embodiments of the present invention will now be described by reference to the drawings.

First Exemplary Embodiment

Figure 1:
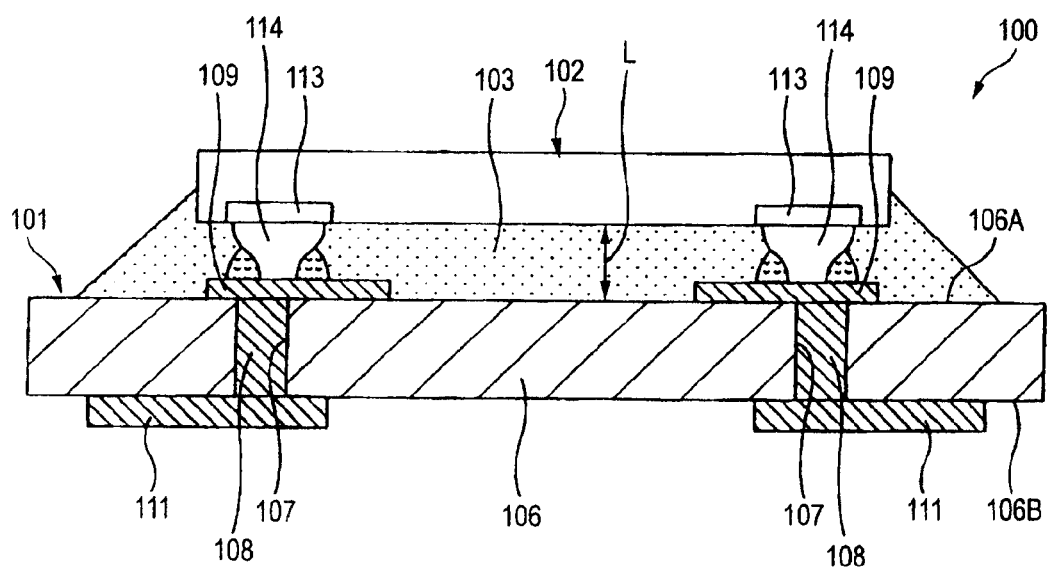
FIG. 1 is a cross sectional view of a related-art semiconductor device.
Figure 2:
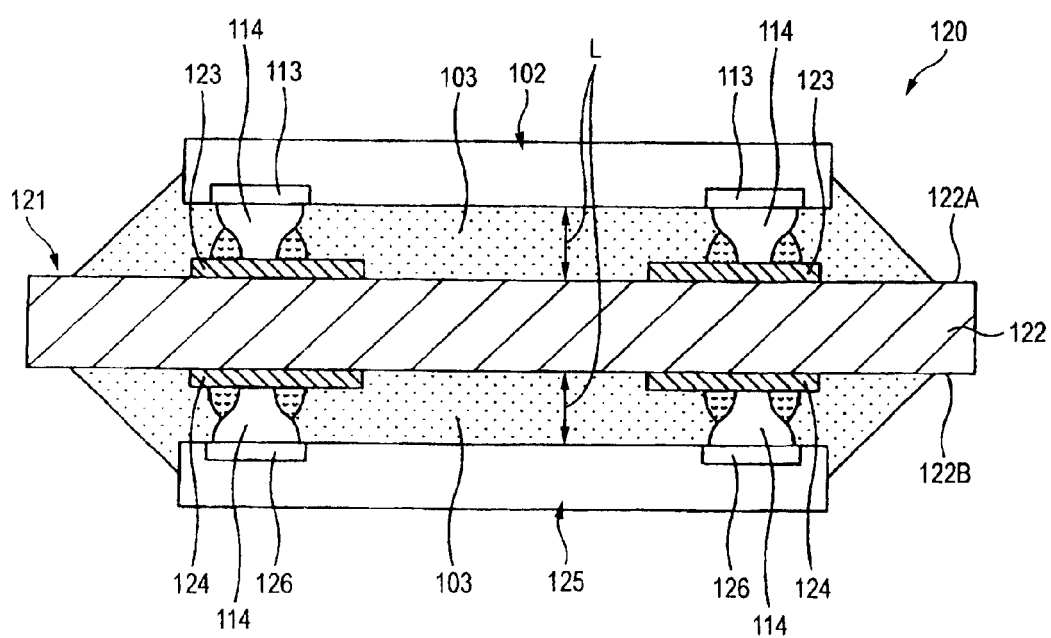
FIG. 2 is a cross sectional view of another related-art semiconductor device.
Figure 3:
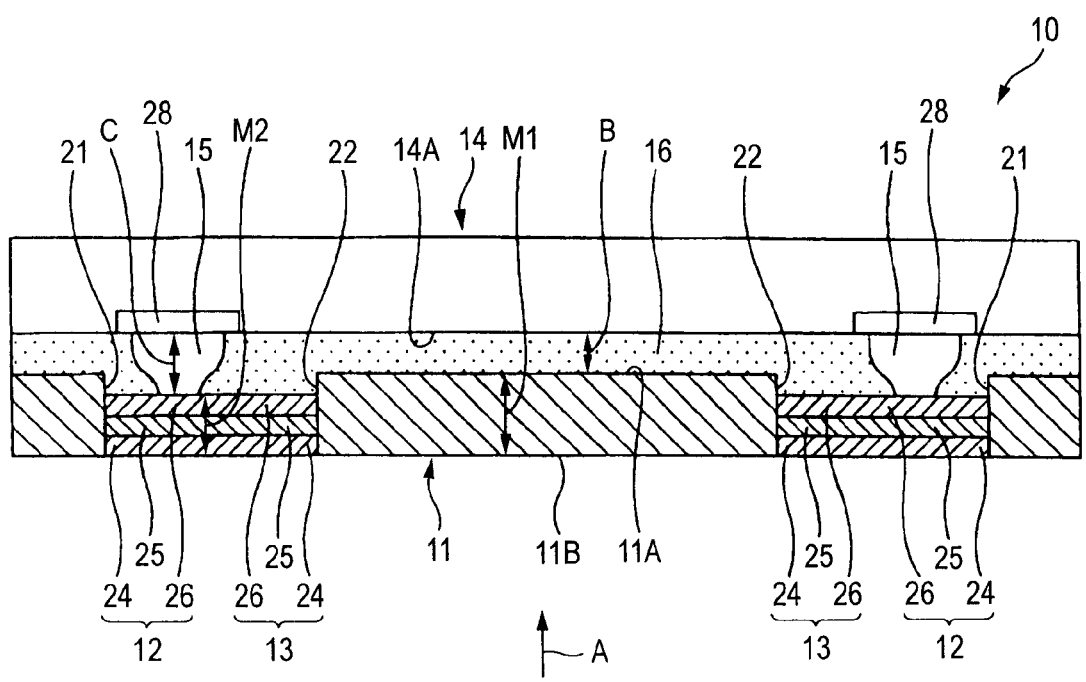
FIG. 3 is a cross sectional view of a semiconductor device of a first exemplary embodiment of the present invention.

FIG. 3 is a cross sectional view of a semiconductor device of a first exemplary embodiment of the present invention.

By reference to FIG. 3, a semiconductor device 10 of the first exemplary embodiment has a low elastic resin member 11, external connection pads 12, a wiring 13, a semiconductor chip 14, internal connection terminals 15 and an underfill resin 16.

Figure 4:
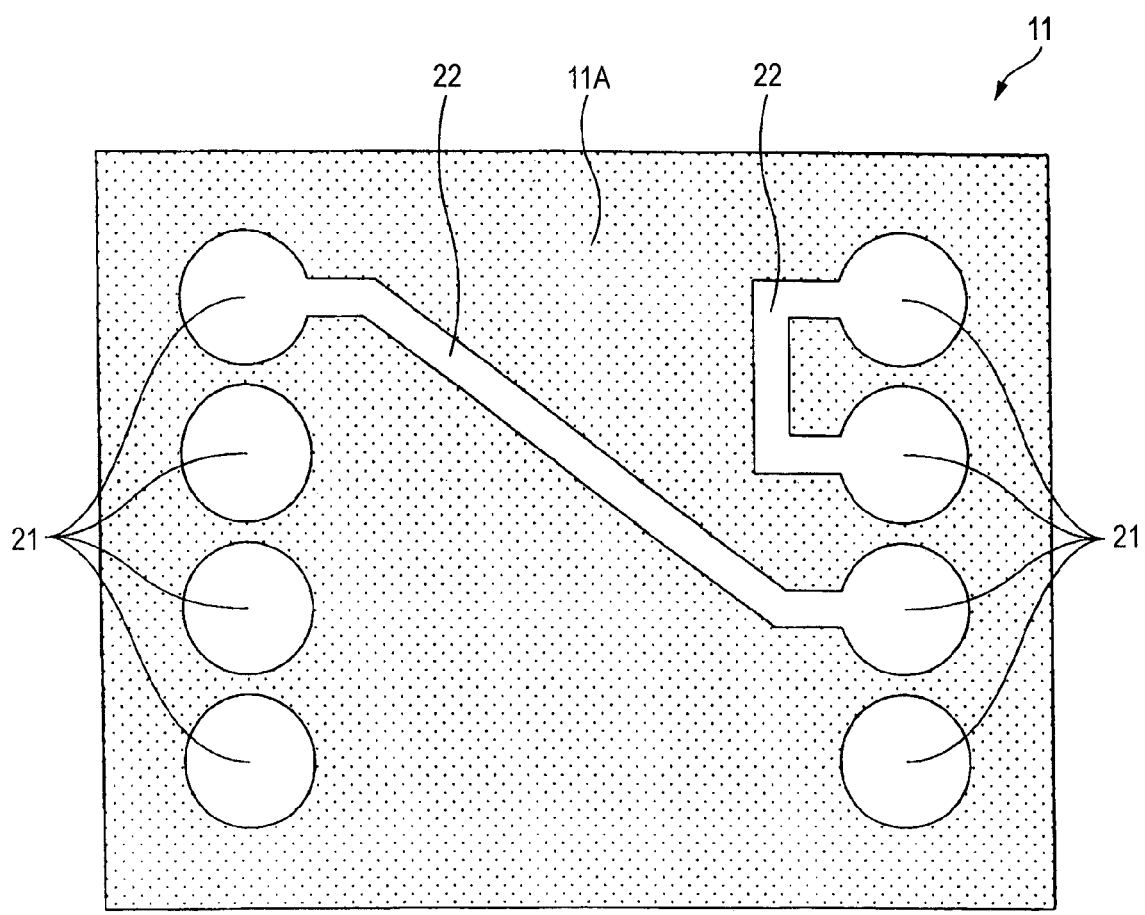
FIG. 4 is a plan view of a low elastic resin member provided in the semiconductor device of the first exemplary embodiment of the present invention.

FIG. 4 is a plan view of the low elastic resin member provided in the semiconductor device of the first exemplary embodiment of the present invention. In FIG. 4, constituent elements which are the same as those of the semiconductor element 10 of the first exemplary embodiment are assigned the same reference numerals.

By reference to FIGS. 3 and 4, the low elastic resin member 11 is formed into the shape of a plate and arranged so as to oppose a surface 14A of the semiconductor chip 14 on which a plurality of electrode pads 28 are formed.

The low elastic resin member 11 is a member for making distance B (first distance) between the surface 14A of the semiconductor chip 14 and an upper surface 11A of the low elastic resin member 11 narrower than distance C (second distance) between the electrode pad 28 (as described later) and the external connection pad 12. The distance B may be set to, e.g., 10 μm. Further, the thickness M1 of the low elastic resin member 11 may be set to, e.g., 25 μm.

As mentioned above, the low elastic resin member 11 is provided so as to oppose the surface 14A of the semiconductor chip 14 on which the plurality of electrode pads 28 are provided. The distance B between the semiconductor chip 14 and the low elastic resin member 11 is narrowed, thereby enabling a reduction in the thickness of the underfill resin 16 interposed between the semiconductor chip 14 and the low elastic resin member 14. Hence, warpage of the semiconductor device 10 attributable to the underfill resin 16 can be reduced.

For example, an epoxy resin, an urethane resin, a silicone resin, or the like, can be used as a resin forming the low elastic resin member 11. The elastic modulus of the low elastic resin member 11 may preferably be in a range of 0.1 MPa to 100 MPa.

As mentioned above, the elastic modulus of the low elastic resin member 11 is set to be in a range of 0.1 MPa to 100 MPa (more preferably, 0.1 MPa to 10 MPa), so that the low elastic resin member 11 can lessen the stress stemming from curing and shrinkage of the underfill resin 16 and the stress caused by a difference between the thermal expansion coefficient of the semiconductor chip 14 and the thermal expansion coefficient of the underfill resin 16. Hence, warpage of the semiconductor device 10 can be reduced. It is technically difficult to manufacture the low elastic resin member 11 whose elastic modulus is smaller than 0.1 MPa. When the elastic modulus of the low elastic resin member 11 is greater than 100 MPa, the stress cannot be lessened sufficiently. Further, the low elastic resin member 11 has a lower elastic modulus than the underfill resin 16.

Through parts 21 and 22 are formed in the low elastic resin member 11. The through parts 21 are formed in the vicinity of an outer periphery of the low elastic resin member 11. The through parts 21 is formed in an essentially-circular shape when viewed from the top (see FIG. 4). When viewed from the top, the through parts 21 are made wider than the through part 22. Each of the through parts 21 is provided with the external connection pad 12, and a portion of external connection pad 12 opposite to the electrode pad 28 is exposed from the through part 21.

The through part 22 is formed in an area of the low elastic resin member 11 located inward compared with the location where the through parts 21 are formed. The through part 22 interconnects the plurality of through parts 21 and is formed integrally with the plurality of through parts 21. The through part 22 is used for routing the wiring 13. An upper surface of the wiring 13 is exposed from the through part 22.

Figure 5:
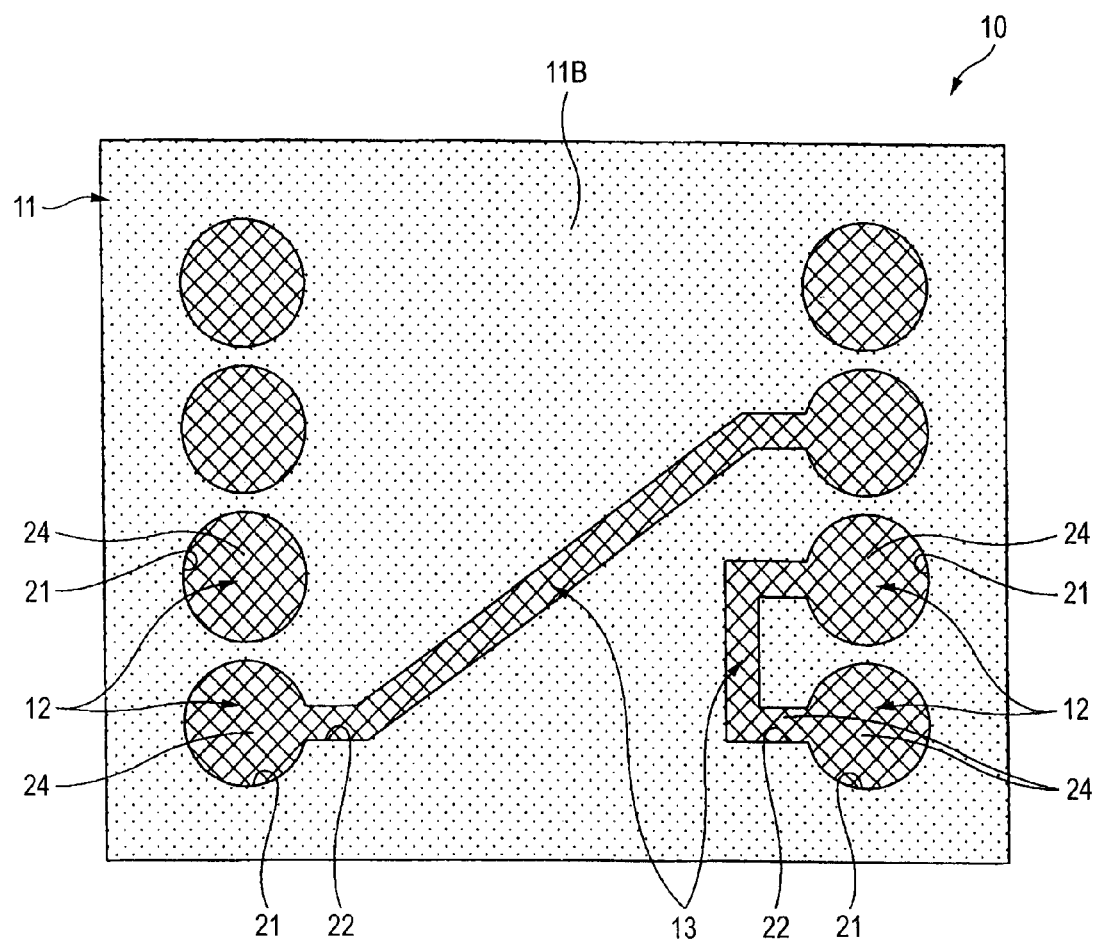
FIG. 5 is a view of the semiconductor device shown in FIG. 3, viewed from arrow A.

FIG. 5 is a view of the semiconductor device shown in FIG. 3, viewed from arrow A.

By reference to FIGS. 3 and 5, the external connection pads 12 are provided in the respective through parts 21. The external connection pad 12 is formed by means of successively stacking a first metal layer 24, a second metal layer 25 and a third metal layer 26 one on top of the other.

The first metal layer 24 is provided on a lower end of the through part 21. A lower surface 24A of the first metal layer 24 is essentially level with the lower surface 11B of the low elastic resin member 11. For instance, an Au layer may be used as the first metal layer 24. The thickness of the first metal layer 24 may be set to 1 μm, for example. When the semiconductor device 10 is connected to a mounting board such as a mother board, solder balls (not illustrated) are connected to the lower surface 24A of the first metal layer 24.

The second metal layer 25 is provided in each of the through parts 21 so as to cover the upper surface of the first metal layer 24. For example, a Cu layer may be used as the second metal layer 25. The thickness of the second metal layer 25 may be set to 8 μm.

The third metal layer 26 is provided in each of the through parts 21 so as to cover the upper surface of the second metal layer 25. The third metal layer 26 is connected to the internal connection terminal 15 electrically connected to the semiconductor chip 14. As a result, the external connection pads 12 are electrically connected to the semiconductor chip 14. For example, an Au layer may be used as the third metal layer 26. The thickness of the third metal layer 26 may be set to 1 μm, for example.

The thickness M2 of the above-configured external connection pad 12 may preferably be smaller than the thickness M1 of the low elastic resin member 11. Thus, the thickness M2 of the external connection pad 12 is smaller than the thickness M1 of the low elastic resin member 11, thereby making it possible to render distance C between the electrode pad 28 and the external connection pad 12 wider than the distance B. As a result, a sufficient amount of underfill resin 16 can be interposed between the electrode pad 28 and the external connection pad 12. Hence, sufficient connection strength can be ensured among the electrode pad 28, the external connection pad 12, and the internal connection terminal 15.

The wiring 13 is formed by successively providing the first metal layer 24, the second metal layer 25, and the third metal layer 26 one on top of the other. The wiring 13 is provided in the through part 22. The wiring 13 is formed integrally with the external connection pad 12. The wiring 13 is used for establishing electrical connection among the plurality of external connection pads 12.

By reference to FIG. 3, the semiconductor chip 14 has a semiconductor substrate (not shown), a semiconductor integrated circuit (not shown) fabricated on the semiconductor substrate, and the plurality of pads 28 electrically connected to the semiconductor integrated circuit. The plurality of electrode pads 28 are electrically connected to the external connection pads 12 by the internal connection terminals 15. The semiconductor chip 14 is bonded to the external connection pads 12 by flip-chip bonding.

The internal connection terminals 15 are provided in the plurality of electrode pads 28, respectively. Lower ends of the internal connection terminals 15 are connected to the external connection pads 12 (more specifically, the third metal layer 26). The internal connection terminals 15 are used for establishing an electrical connection with the external connection pad 12, the wiring 13, and the semiconductor chip 14. For example, a bump can be used as the internal connection terminal 15.

The underfill resin 16 is provided so as to fill a gap between the low elastic resin member 11 and the semiconductor chip 14 and a gap among the external connection pad 12, the wiring 13, and the semiconductor chip 14. For instance, an anisotropic conductive resin, an insulating resin, and the like, can be used as the underfill resin 16.

According to the semiconductor device of the exemplary embodiment, the low elastic resin member 11 is provided so as to oppose the surface 14A of the semiconductor chip 14 on which the electrode pads 28 are provided. The distance B between the low elastic resin member 11 and the semiconductor chip 14 is made narrower than the distance C between the external connection pad 12 and the electrode pad 28, thereby reducing the thickness of the underfill resin 16 sandwiched between the low elastic resin member 11 and the surface 14A of the semiconductor chip 14. As a result, warpage of the semiconductor device 10 attributable to the underfill resin 16 can be diminished.

The elastic modulus of the low elastic resin member 11 is set to be in a range of 0.1 MPa to 100 MPa, thereby lessening stress stemming from curing and shrinkage of the underfill resin 16, stress caused by a difference between the thermal expansion coefficient of the semiconductor chip 14 and the thermal expansion coefficient of the underfill resin 16, or the like. Hence, warpage of the semiconductor device 10 can be reduced.

The thickness M2 of the external connection pad 12 is made smaller than the thickness M1 of the low elastic resin member 11, thereby broadening the distance C between the electrode pad 28 and the external connection pad 12. As a result, a sufficient amount of underfill resin 16 can be interposed between the electrode pad 28 and the external connection pad 12. Hence, sufficient connection strength can be ensured between the electrode pad 28, the external connection pad 12, and the internal connection terminal 15.

Figure 6:
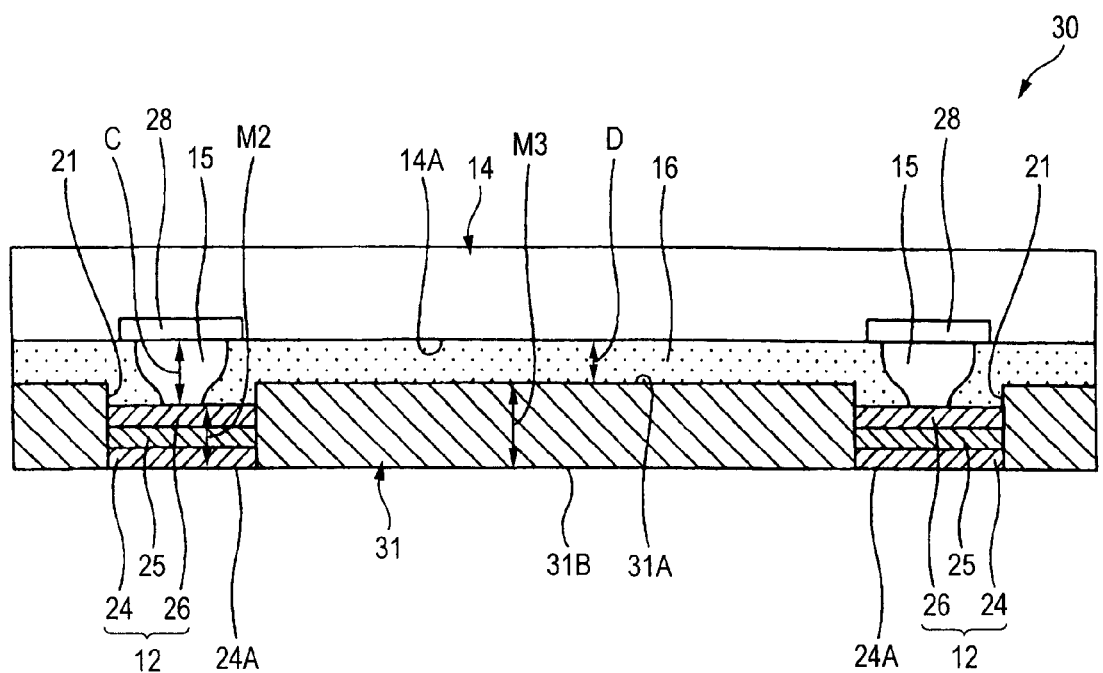
FIG. 6 is a cross sectional view of the semiconductor device according to a modification of the first exemplary embodiment of the present invention.

FIG. 6 is a cross sectional view of a semiconductor device according to a modification of the first exemplary embodiment of the present invention. In FIG. 6, constituent elements which are the same as those of the semiconductor device 10 of the first exemplary embodiment are assigned the same reference numerals.

By reference to FIG. 6, a semiconductor device 30 according to the modification of the first exemplary embodiment is provided with a low elastic resin member 31 in place of the low elastic resin member 11 provided on the semiconductor device 10 of the first exemplary embodiment. The semiconductor device 30 is formed in the same manner as the semiconductor device 10 except that the wiring 13 provided in the semiconductor device 10 is removed from the constituent elements.

Figure 7:
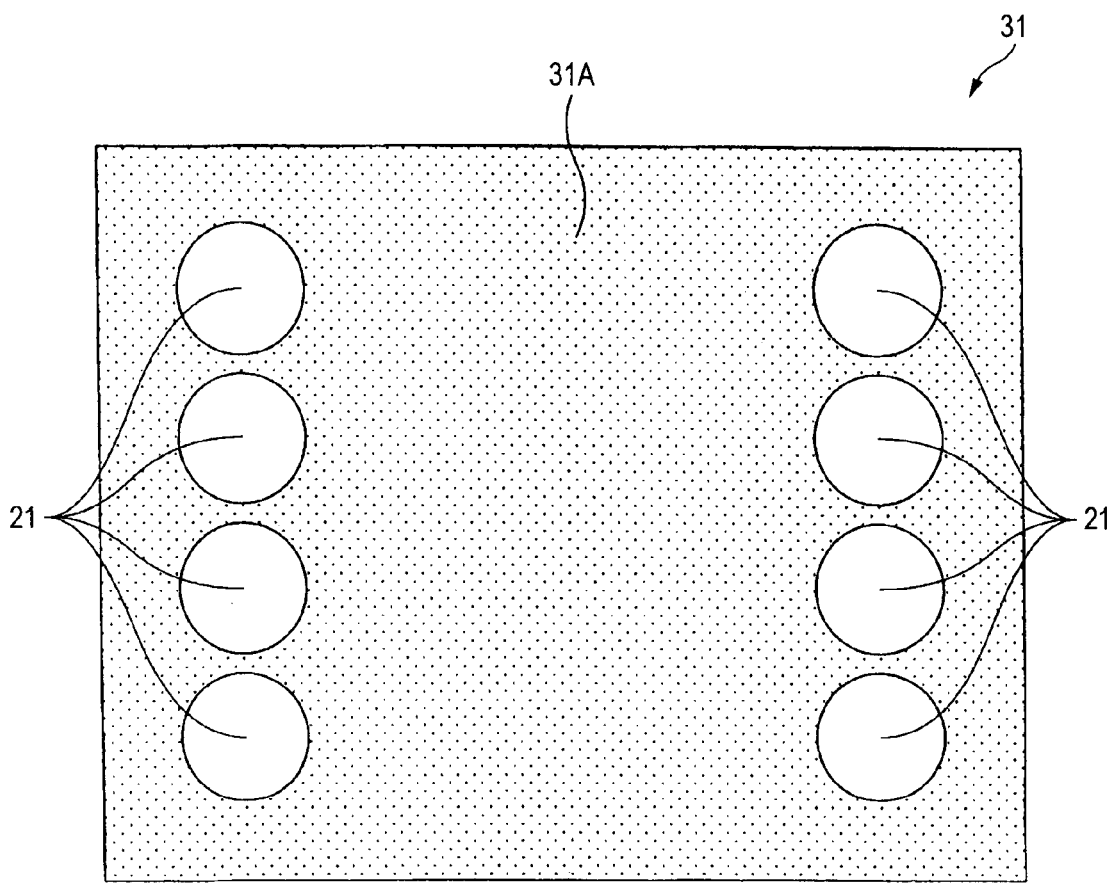
FIG. 7 is a plan view of a low elastic resin member provided in the semiconductor device according to the modification of the first exemplary embodiment of the present invention.

FIG. 7 is a plan view of the low elastic resin member provided in the semiconductor device according to the modification of the first exemplary embodiment of the present invention in FIG. 6.

By reference to FIGS. 6 and 7, the low elastic resin member 31 is formed in the same manner as the low elastic resin member 11 except that the resin member 31 does not have the through part 22 formed in the previously-described low elastic resin member 11 (see FIG. 4). The thickness M3 of the low elastic resin member 31 is set to be greater than the thickness M2 of the external connection pad 12. When the thickness M2 of the external connection pad 12 is 10 μm, the thickness M3 of the low elastic resin member 31 may be set to 25 μm, for example.

Distance D (first distance) between the low elastic resin member 31 and the semiconductor chip 14 is set to be narrower than the distance C between the electrode pad 28 and the external connection pad 12. When the distance C is 35 μm, the distance D may be set to 10 μm, for example. The lower surface of the external connection pad 12 (specifically, a lower surface 24A of the first metal layer 24) is made essentially level with the lower surface 31B of the low elastic resin member 31.

The semiconductor device 30 configured as above can obtain the same advantage as the semiconductor device 10 of the first exemplary embodiment.

FIGS. 8 to 13 are views showing processes for fabricating the semiconductor device of the first exemplary embodiment of the present invention. In FIGS. 8 through 13, the constituent elements which are the same as those of the semiconductor device 10 of the first exemplary embodiment are assigned the same reference numerals.

The method for fabricating the semiconductor device 10 according to the first exemplary embodiment of the present invention will be described by reference to FIGS. 8 to 13. First, a metal plate 35 as a support plate at the time of fabrication of the semiconductor device 10 is prepared in a process shown in FIG. 8. For instance, a Cu plate may be used as the metal plate 35. The thickness M4 of the metal plate 35 may be set to 200 μm, for example.

Figure 9:
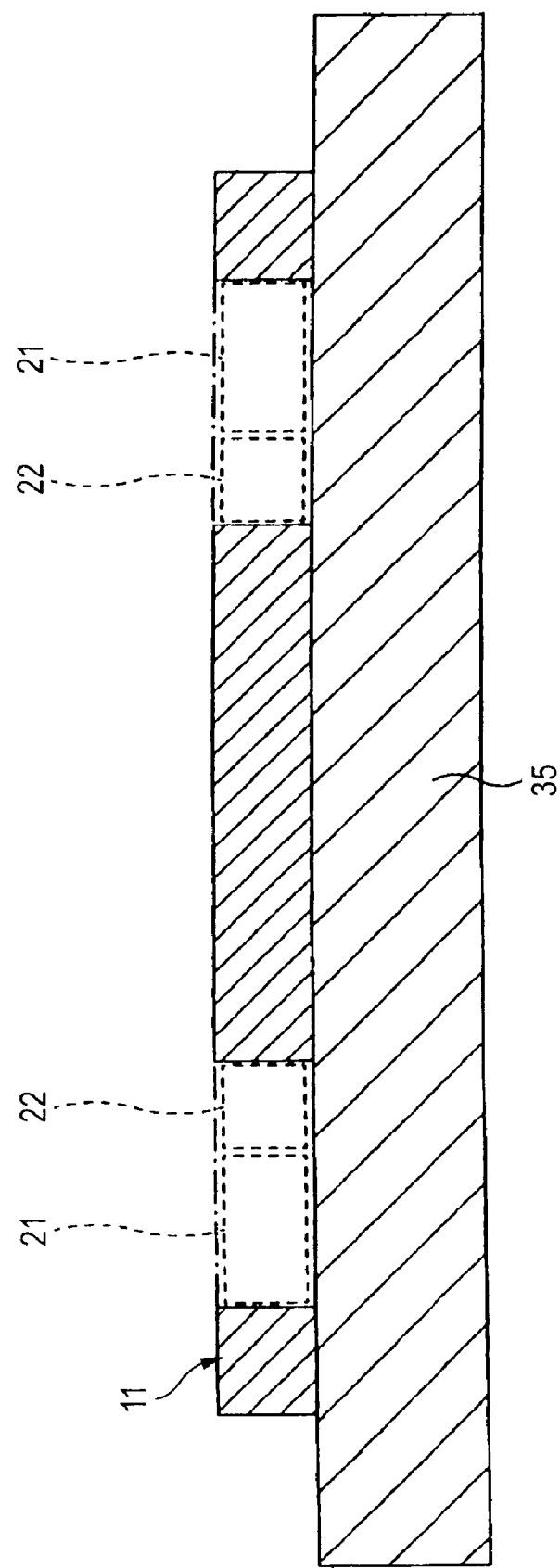
FIG. 9 is a view showing a second process step for fabricating the semiconductor device of the first exemplary embodiment of the present invention.

In a process shown in FIG. 9, the low elastic resin member 11 having the through parts 21 and 22 is formed on the metal plate 35. Specifically, for example, an epoxy resin having the elastic modulus of 0.1 MPa to 100 MPa is formed on the metal plate 35, and then the through parts 21 and 22 are subsequently formed in the epoxy resin using a laser, thereby forming the low elastic resin member 11. An essential requirement for a resin that serves as a base material of the low elastic resin member 11 is a resin having the elastic modulus of 0.1 MPa to 100 MPa, and the base material is not limited to the epoxy resin. Specifically, an urethane resin, a silicone resin or the like, having an elastic modulus of 0.1 MPa to 100 MPa may be used as the base material of the low elastic resin member 11. The thickness M1 of the low elastic resin member 11 may be set to 25 μm, for example.

Figure 10:
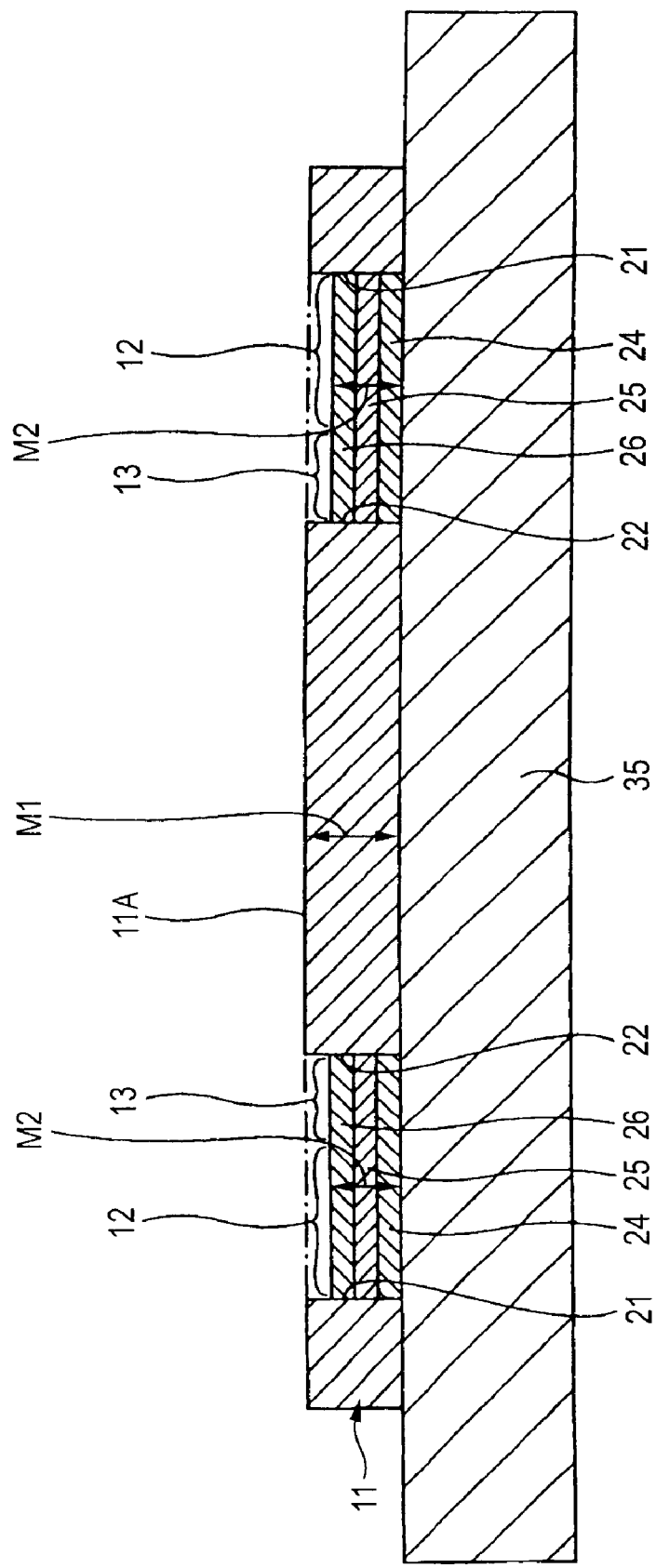
FIG. 10 is a view showing a third process step for fabricating the semiconductor device of the first exemplary embodiment of the present invention.

In a process shown in FIG. 10, the first metal layer 24, the second metal layer 25 and the third metal layer 26 are formed successively on the metal plate 35 exposed from the through parts 21 and 22 through electrolytic plating while the metal plate 35 is taken as a feeding layer. Thus, the external connection pad 12, which is formed of the first through third metal layers 24 to 26, is formed in the through part 21. The wiring 13, which is formed of the first to third metal layers 24 to 26, is formed in the through part 22.

For instance, an Au layer may be used as the first metal layer 24, and the thickness of the first metal layer may be set to 1 µm, for example. For instance, a Cu layer may be used as the second metal layer 25, and the thickness of the second metal layer may be set to, e.g., 8 µm. For instance, an Au layer may be used as the third metal layer 26, and the thickness of the metal layer can be set to, e.g., 1 µm. Further, the thickness M2 of the external connection pad 12 is set to be smaller than the thickness M1 of the low elastic resin member 11. For instance, when the thickness M1 of the low elastic resin member 11 is 25 µm, the thickness M2 of the external connection pad 12 may be set to 10 µm.

Figure 11:
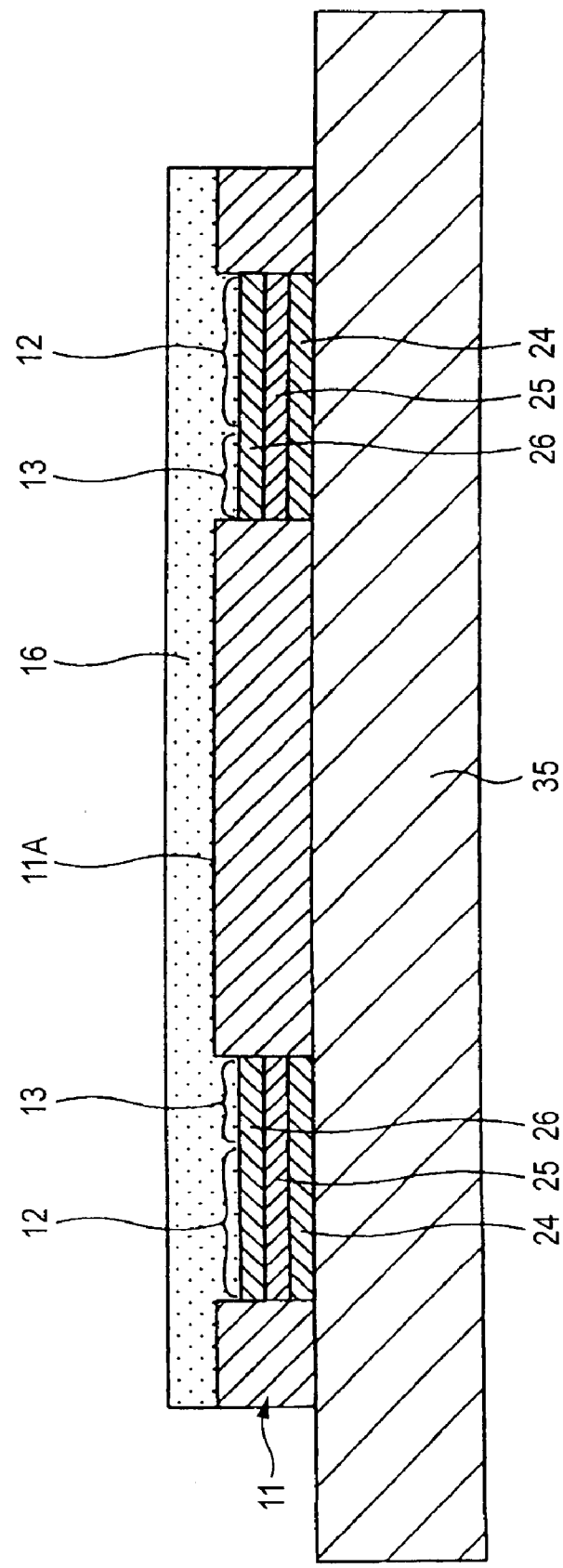
FIG. 11 is a view showing a fourth process step for fabricating the semiconductor device of the first exemplary embodiment of the present invention.

Next, the underfill resin 16 is formed in a process shown in FIG. 11 so as to cover an upper surface of the low elastic resin member 11, an upper surface of the external connection pad 12, and an upper surface of the wiring 13. Specifically, for instance, a film-like anisotropic conductive resin [e.g., Anisotropic Conductive Film (ACF)] is affixed to the upper surface of the low elastic resin member 11, the upper surface of the external connection pad 12, and the upper surface of the wiring 13. A film-like insulating resin [e.g., Non-Conductive Film (NCF)] may also be used instead of the film-like anisotropic conductive resin.

Figure 12:
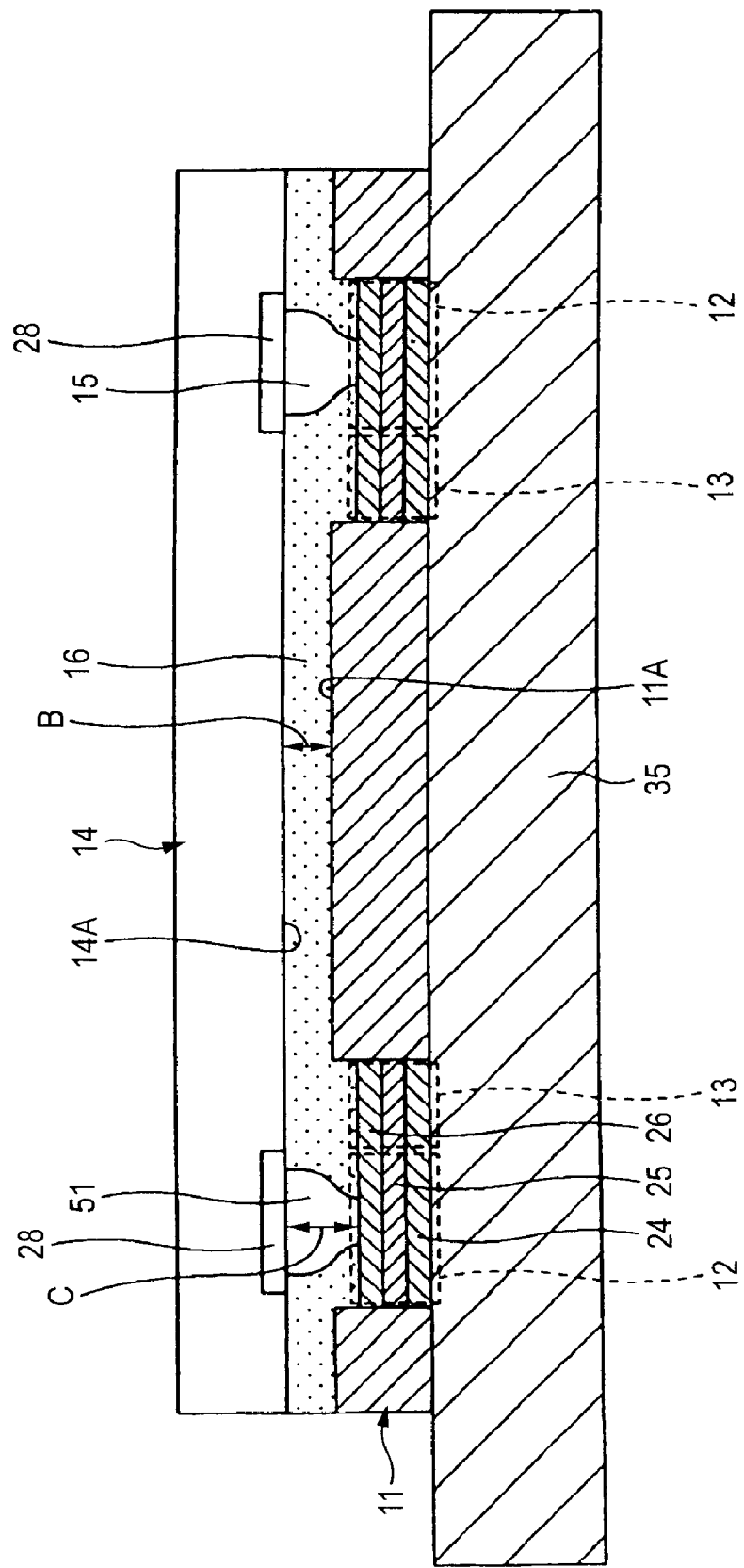
FIG. 12 is a view showing a fifth process step for fabricating the semiconductor device of the first exemplary embodiment of the present invention.

Next, the semiconductor chip 14 in which the internal connection terminal 15 is provided on each of the electrode pads 28 is prepared in process shown in FIG. 12. A structure shown in FIG. 11 is heated, and the semiconductor chip 14 is pressed against the underfill resin 16, thereby pressing the lower end of the internal connection terminal 15 onto the external connection pad 12. At this time, the distance C between the electrode pad 28 and the external connection pad 12 may be set to, e.g., 35 µm. Further, the distance B between the semiconductor chip 14 and the low elastic resin member 11 can be made narrower than the distance C. Specifically, the distance B may be set to, e.g., 10 µm.

As mentioned above, the distance B between the surface 14A of the semiconductor chip 14 and the low elastic resin member 11 is made narrower than the distance C between the electrode pad 28 and the external connection pad 12, so that the thickness of the underfill resin 16 filled in the gap between the semiconductor chip 14 and the low elastic resin member 11 can be made smaller than that achieved in the related art. Hence, warpage of the semiconductor device 10 attributable to the underfill resin 16 can be diminished.

Figure 13:
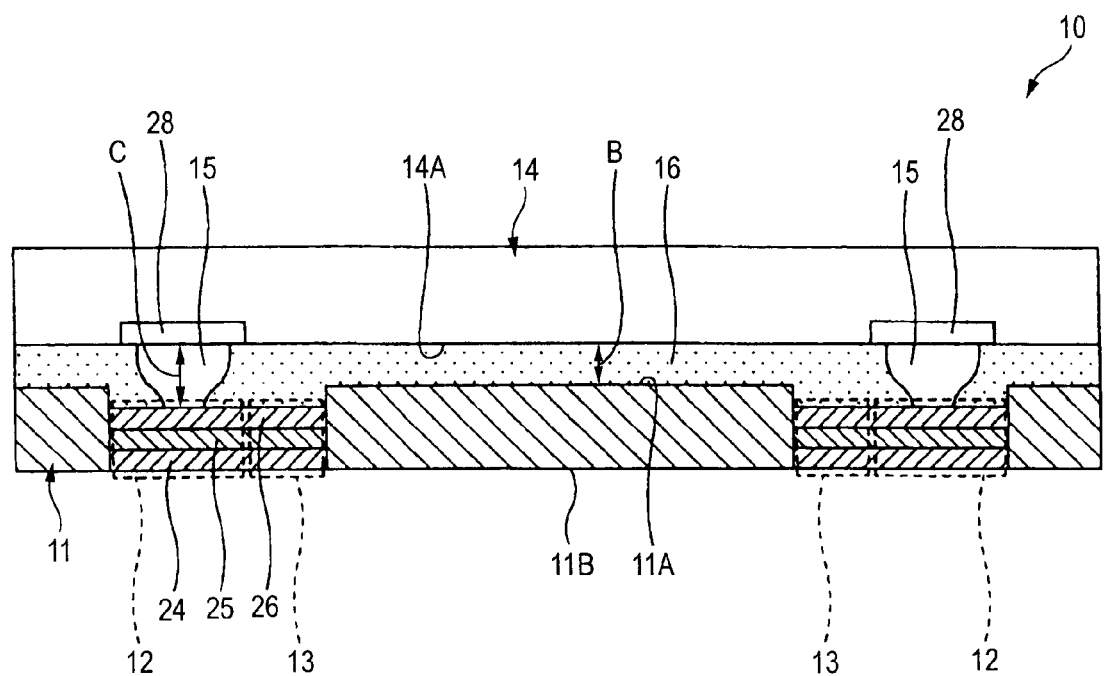
FIG. 13 is a view showing a sixth process step for fabricating the semiconductor device of the first exemplary embodiment of the present invention.

The metal plate 35 is removed in the process shown in FIG. 13. Specifically, the metal plate 35 is removed by means of wet etching, for example. As a result, the semiconductor device 10 is fabricated.

Second Exemplary Embodiment

Figure 14:
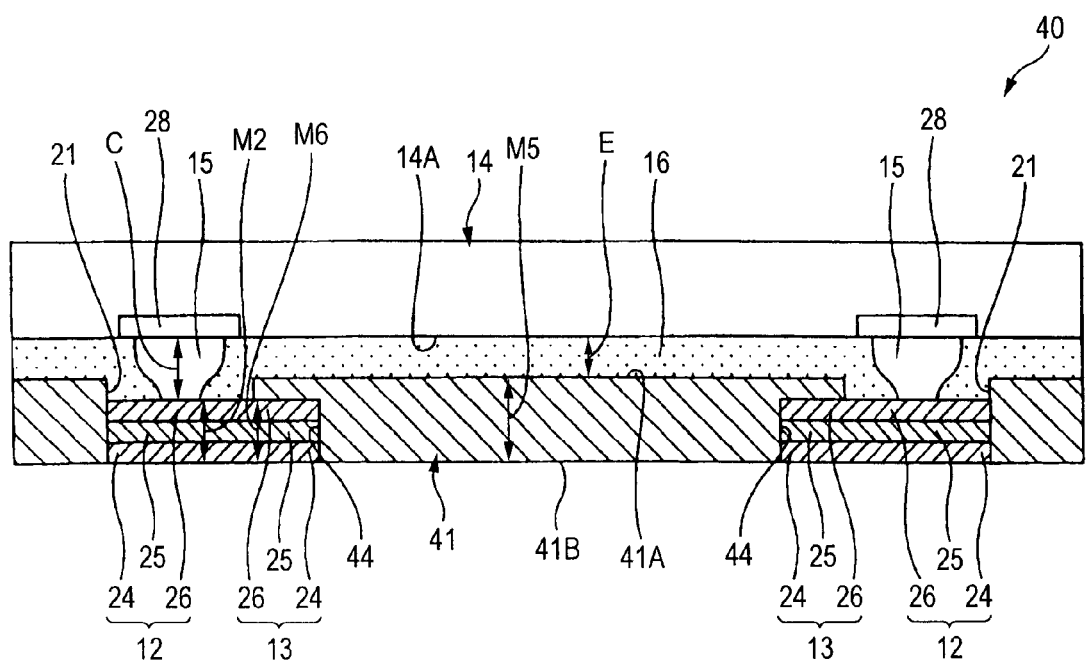
FIG. 14 is a cross sectional view of a semiconductor device of a second exemplary embodiment of the present invention.

FIG. 14 is a cross sectional view of a semiconductor device according to a second exemplary embodiment of the present invention. In FIG. 14, constituent elements which are the same as those of the semiconductor device 10 of the first exemplary embodiment are assigned the same reference numerals.

By reference to FIG. 14, a semiconductor device 40 of the second exemplary embodiment is formed in the same manner as the semiconductor device 10 except that a low elastic resin member 41 is provided instead of the low elastic resin member 11 provided in the semiconductor device 10 of the first exemplary embodiment.

Figure 15:
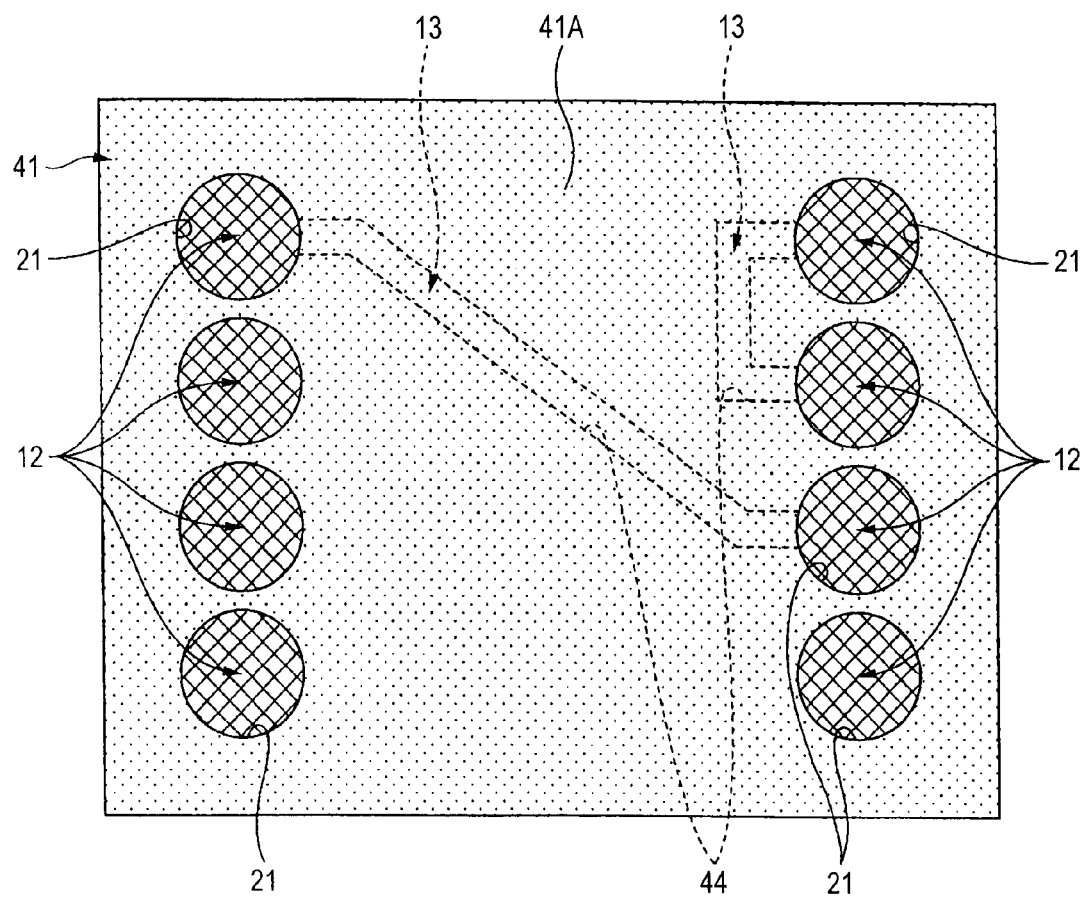
FIG. 15 is a plan view of a low elastic resin member shown in FIG. 14 in which external connection pads and a wiring are formed.
Figure 16:
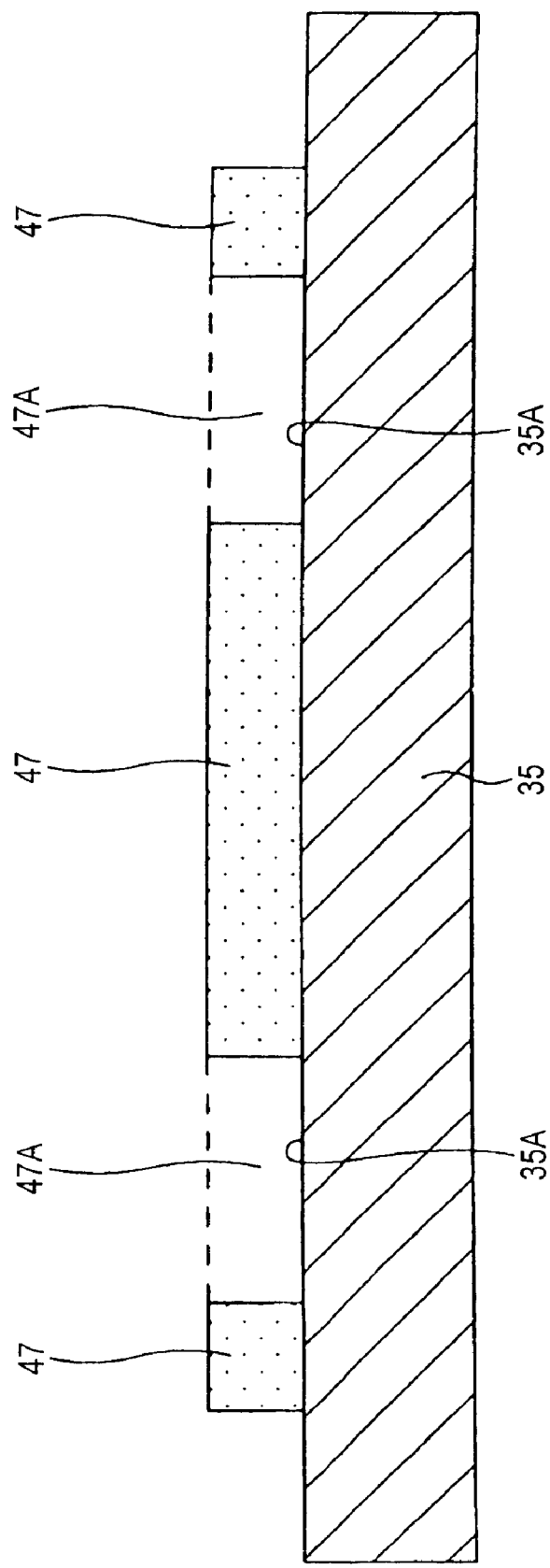
FIG. 16 is a view showing a first process step for fabricating the semiconductor device of the second exemplary embodiment of the present invention.

FIG. 15 is a plan view of the low elastic resin member shown in FIG. 14 where external connection pads and a wiring are formed. In FIG. 15, constituent elements which are the same as those of the semiconductor device 40 shown in FIG. 14 are assigned the same reference numerals.

By reference to FIGS. 14 and 15, the low elastic resin member 41 is formed in the same manner as the semiconductor device 10 except that groove sections 44 are provided in place of the through parts 22 formed in the low elastic resin member 11 described in connection with the first exemplary embodiment.

The groove sections 44 are formed in a lower surface 41B of the low elastic resin member 41. The groove sections 44 are used for routing the wiring 13. An upper surface and side surfaces of the wiring 13 provided in the groove sections 44 are covered with the low elastic resin member 41. A lower surface of the wiring 13 is made essentially level with a lower surface 41B of the low elastic resin member 41.

Compared with the semiconductor device 10 of the first exemplary embodiment, the upper surface of the wiring 13 is covered with the low elastic resin member 41, thereby enabling a reduction in the thickness of the underfill resin 16 provided above the wiring 13. Hence, occurrence of warpage of the semiconductor device 40, which is caused by the underfill resin 16, can be prevented.

The thickness M5 of the low elastic resin member 41 set to be greater than the thickness M2 of the wiring 13 and the thickness M6 of the external connection pad 12. Specifically, when the thickness M2 of the wiring 13 and the thickness M6 of the external connection pad 12 are set to 10 µm, the thickness M5 of the low elastic resin member 41 may be set to 25 µm.

Distance E between the surface 14A of the semiconductor chip 14 and the low elastic resin member 41 is set so as to become narrower than the distance C between the electrode pad 28 and the external connection pad 12. When the distance C is 35 µm, distance E between the surface 14A of the semiconductor chip 14 and the low elastic resin member 41 can be set to, e.g., 10 µm.

According to the semiconductor device of the present embodiment, the upper surface of the wiring 13 is covered with the low elastic resin member 41. As a result, the thickness of the underfill resin 16 provided above the wiring 13 becomes thinner than the thickness of the underfill resin provided in the semiconductor device 10 of the first exemplary embodiment. Hence, occurrence of warpage of the semiconductor device 40, which is caused by the underfill resin 16, can be prevented.

The semiconductor device 40 of the present embodiment can obtain the same advantage as the semiconductor device 10 of the first exemplary embodiment.

FIGS. 16 to 20 are views showing processes for fabricating a semiconductor device of the second exemplary embodiment of the present invention. In FIGS. 16 to 20, constituent elements which are the same as those the semiconductor device 40 of the second exemplary embodiment are assigned the same reference numerals.

Figure 8:
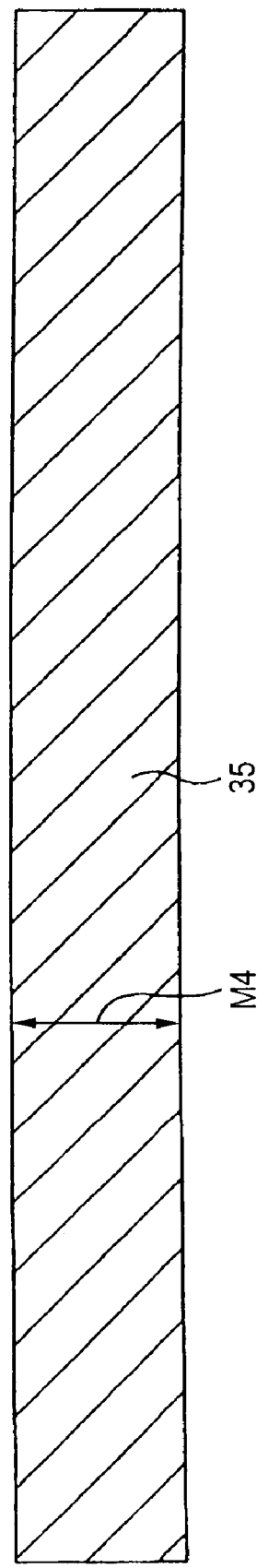
FIG. 8 is a view showing a first process step for fabricating the semiconductor device of the first exemplary embodiment of the present invention.

First, a metal plate 35 in the process shown in FIG. 8 is prepared. Subsequently, in a process shown in FIG. 16, a resist film 47 having an opening section 47A is formed on the metal plate 35. The opening section 47A is formed such that an upper surface 35A of the metal plate 35 corresponding to areas where the external connection pads 12 and the wiring 13 are formed becomes exposed.

Figure 17:
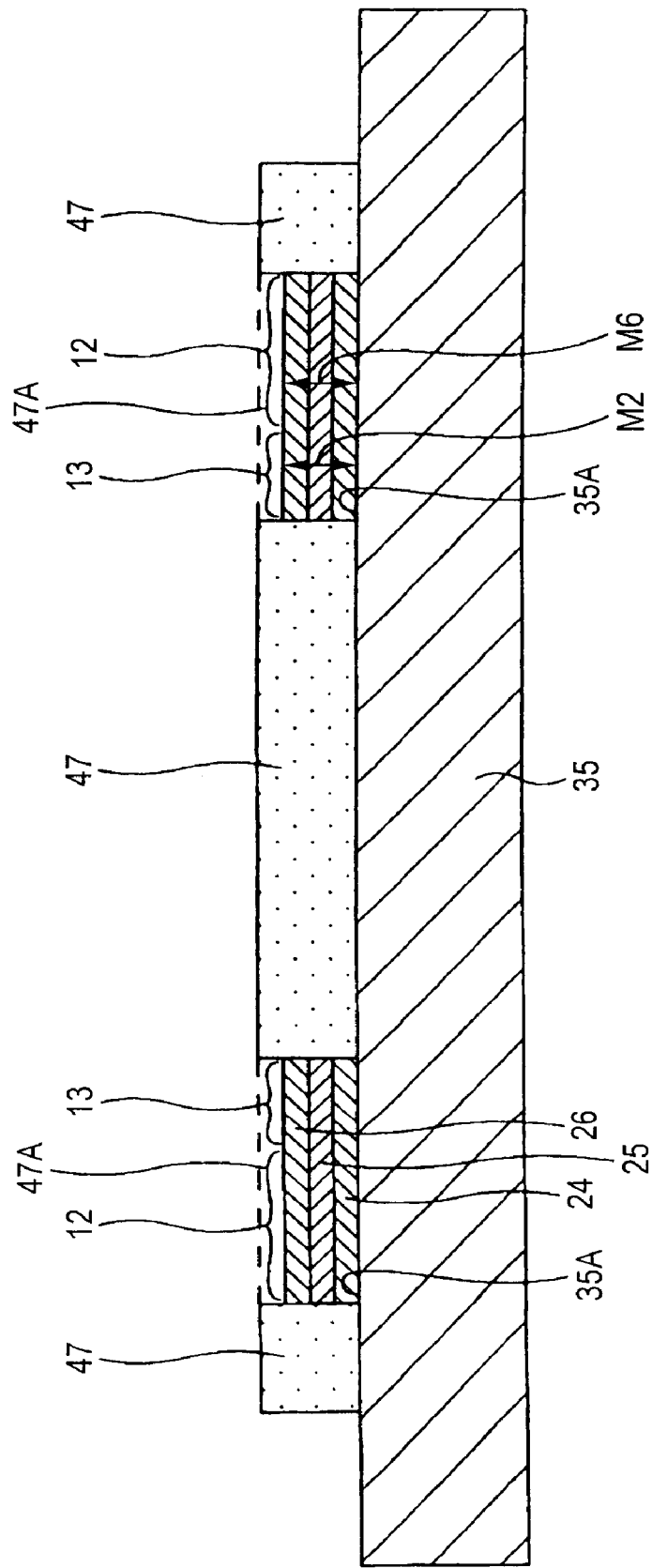
FIG. 17 is a view showing a second process step for fabricating the semiconductor device of the second exemplary embodiment of the present invention.

In a process shown in FIG. 17, the first metal layer 24, the second metal layer 25 and the third metal layer 26 are formed successively on the metal plate 35 exposed from the opening section 47A through electrolytic plating while the metal plate 35 is taken as a feeding layer. As a result, the external connection pad 12, which is formed of the first through third metal layers 24 to 26, and the wiring 13, which is formed of the first to third metal layers 24 to 26, are formed simultaneously.

For instance, an Au layer may be used as the first metal layer 24, and the thickness of the first metal layer may be set to, e.g., 1 μm. For instance, a Cu layer may be used as the second metal layer 25, and the thickness of the second metal layer may be set to, e.g., 8 μm. For instance, an Au layer may be used as the third metal layer 26, and the thickness of the metal layer may be set to, e.g., 1 μm. Further, the thickness M2 of the wiring 13 and the thickness M6 of the external connection pad 12 may be set to 10 μm.

Figure 18:
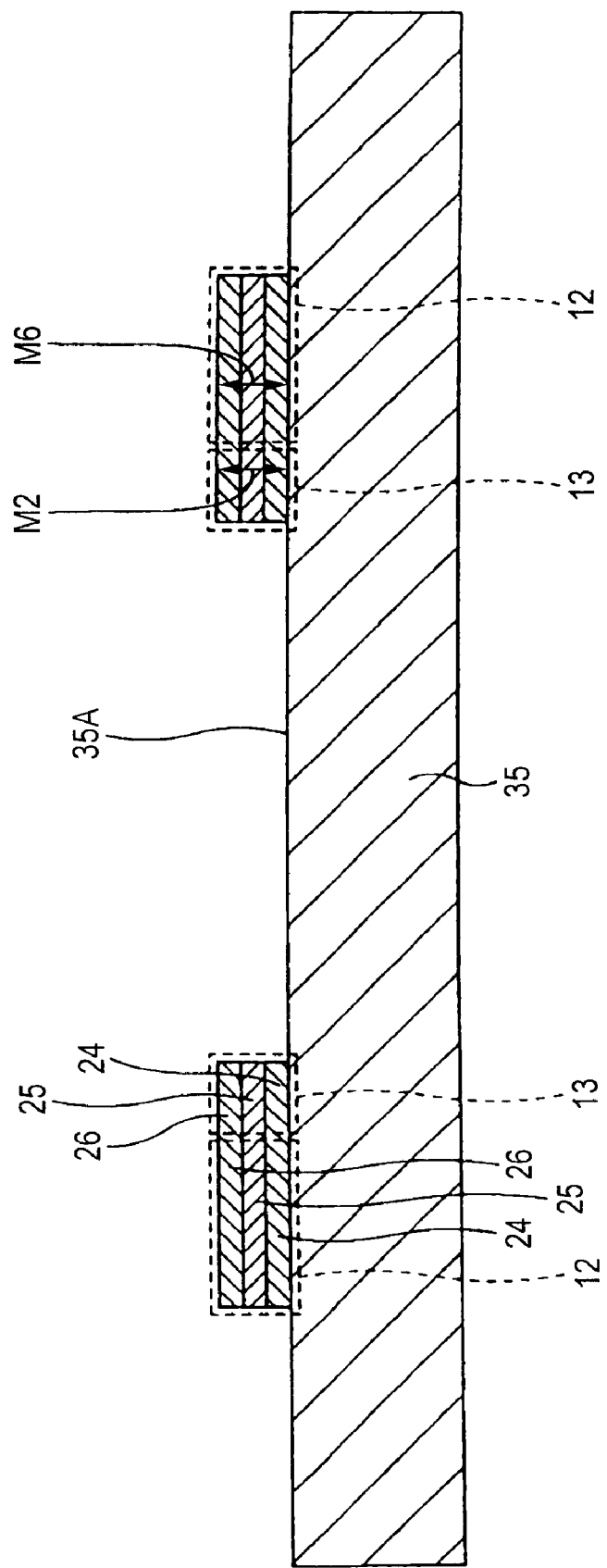
FIG. 18 is a view showing a third process step for fabricating the semiconductor device of the second exemplary embodiment of the present invention.

Next, the resist film 47 is removed in a process shown in FIG. 18. Subsequently, in a process shown in FIG. 19, there is formed the low elastic resin member 41, which covers the side surfaces of the external connection pads 12 and the upper and side surfaces of the wiring 13 and exposes the upper surface of each of the external connection pads 12, on the metal plate 35. Specifically, for instance, an epoxy resin having the elastic modulus of 0.1 MPa to 100 MPa is formed over the metal plate 35 where the external connection pads 12 and the wiring 13 are provided. Subsequently, opening sections (the opening sections constitute portions of the through parts 21) which exposes the upper surface of the external connection pads 12 from the epoxy resin are formed using a laser, so that the low elastic resin member 41 is formed. Portions of the through parts 21 and the groove sections 44 are formed by means of pressing the epoxy resin against the external connection pads 12 and the wiring 13.

An essential requirement for a resin which serves as a base material of the low elastic resin member 41 is a resin having the elastic modulus of 0.1 MPa to 100 MPa. The base material is not limited to the epoxy resin. Specifically, an urethane resin, a silicone resin and the like, having the elastic modulus of 0.1 MPa to 100 MPa may be used as the base material of the low elastic resin member 41. The thickness M5 of the low elastic resin member 41 is made greater than the thickness M2 of the wiring 13 and the thickness M6 of the external connection pad 12. More specifically, when the thickness M2 of the wiring 13 and the thickness M6 of the external connection pad 12 are set to 10 μm, the thickness M5 of the low elastic resin member 41 may be set to 25 μm.

Figure 20:
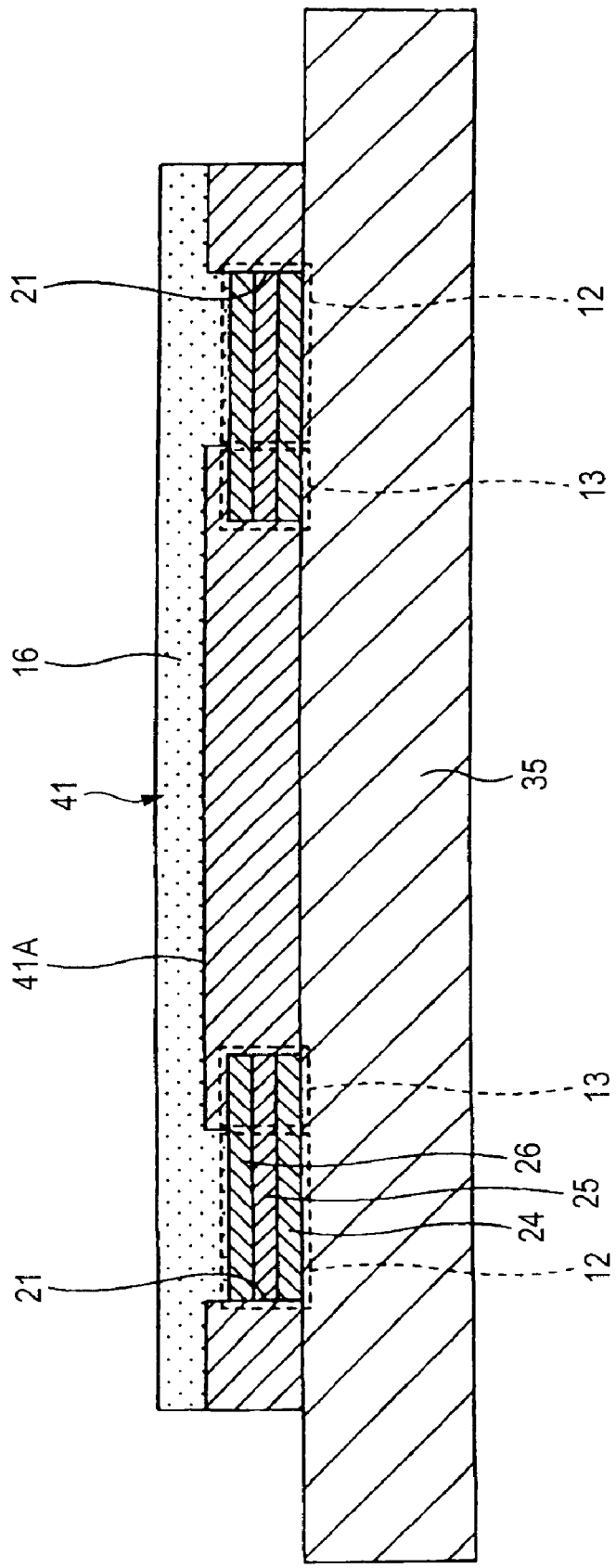
FIG. 20 is a view showing a fifth process step for fabricating the semiconductor device of the second exemplary embodiment of the present invention.

Next, in a process shown in FIG. 20, the underfill resin 16 is formed so as to cover the upper surface of the external connection pad 12 and the upper surface 41A of the low elastic resin member 41. Specifically, for instance, a film-like anisotropic conductive resin [e.g., Anisotropic Conductive Film (ACF)] is affixed to an upper surface of the external connection pad 12 and an upper surface of the low elastic resin member 41, thereby forming the underfill resin 16. A film-like insulating resin [e.g., Non-Conductive Film (NCF)] may also be used instead of the film-like anisotropic conductive resin.

Subsequently, the same processes as those shown in FIGS. 12 and 13 described in connection with the first exemplary embodiment are performed, so that the semiconductor device 40 is fabricated.

Third Exemplary Embodiment

Figure 21:
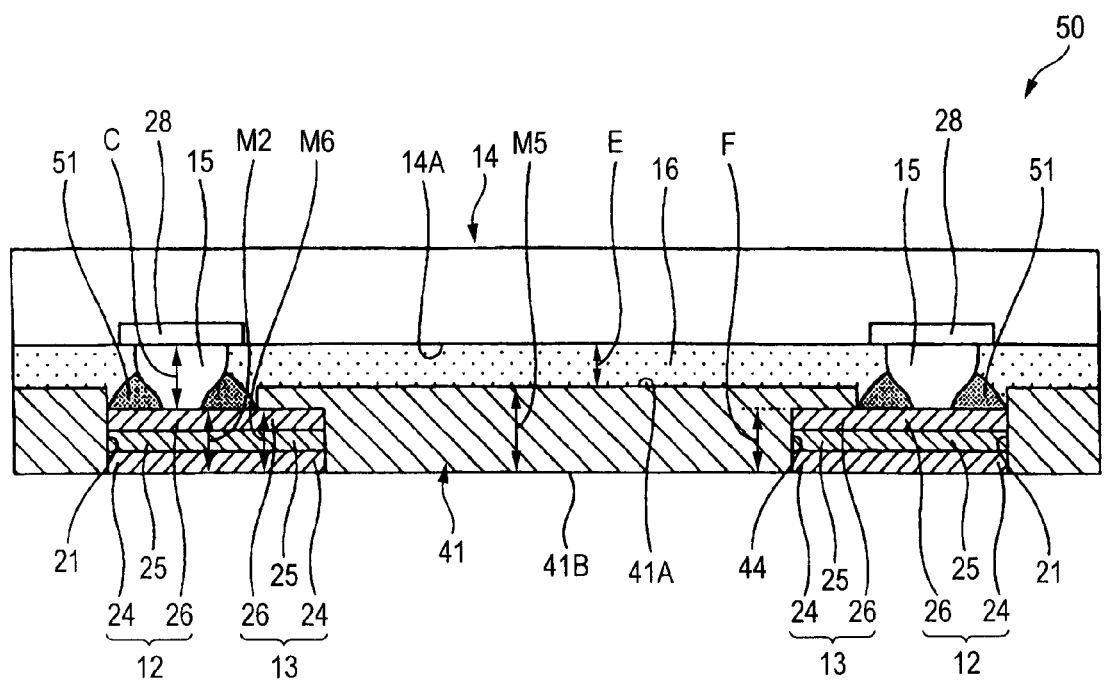
FIG. 21 is a cross sectional view of a semiconductor device of a third exemplary embodiment of the present invention.

FIG. 21 is a cross sectional view of a semiconductor device according to a third exemplary embodiment of the present invention. In FIG. 21, constituent elements which are the same as those of the semiconductor device 40 of the second exemplary embodiment are assigned the same reference numerals.

By reference to FIG. 21, a semiconductor device 50 of the third exemplary embodiment is formed in the same manner as the semiconductor device 40 of the second exemplary embodiment except that the semiconductor device 40 of the second exemplary embodiment is provided with solder 51.

The solder 51 is provided so as to extend from the sidewalls of the internal connection terminal 15 to the upper surface of the external connection pad 12. The solder 51 is used for enhancing connection strength between the internal connection terminal 15 and the external connection pad 12.

According to the semiconductor device of the present embodiment, occurrence of warpage, which is caused by the underfill resin 16, is prevented and connection strength between the internal connection terminal 15 and the external connection pad 12 can be reinforced by means of the solder 51.

FIGS. 22 to 25 are views showing processes for fabricating the semiconductor device of the third exemplary embodiment of the present invention. In FIGS. 22 to 25, constituent elements which are the same as those of the semiconductor device 50 of the third exemplary embodiment are assigned the same reference numerals.

Figure 19:
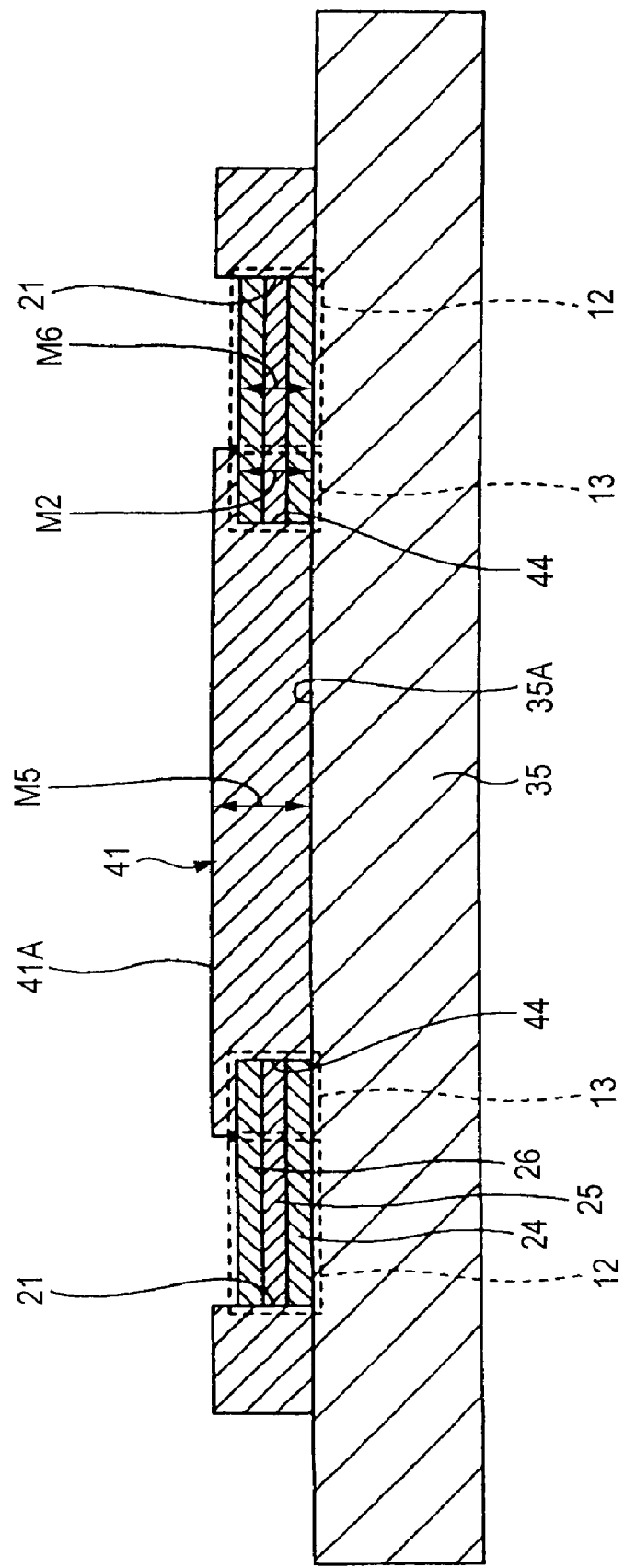
FIG. 19 is a view showing a fourth process step for fabricating for manufacturing the semiconductor device of the second exemplary embodiment of the present invention.

The method for fabricating the semiconductor device 50 of the third exemplary embodiment of the present invention will be described by reference to FIGS. 22 to 25. First, a structure shown in FIG. 19 is formed in the same processes as those shown in FIGS. 16 to 19 described in connection with the second exemplary embodiment.

Figure 22:
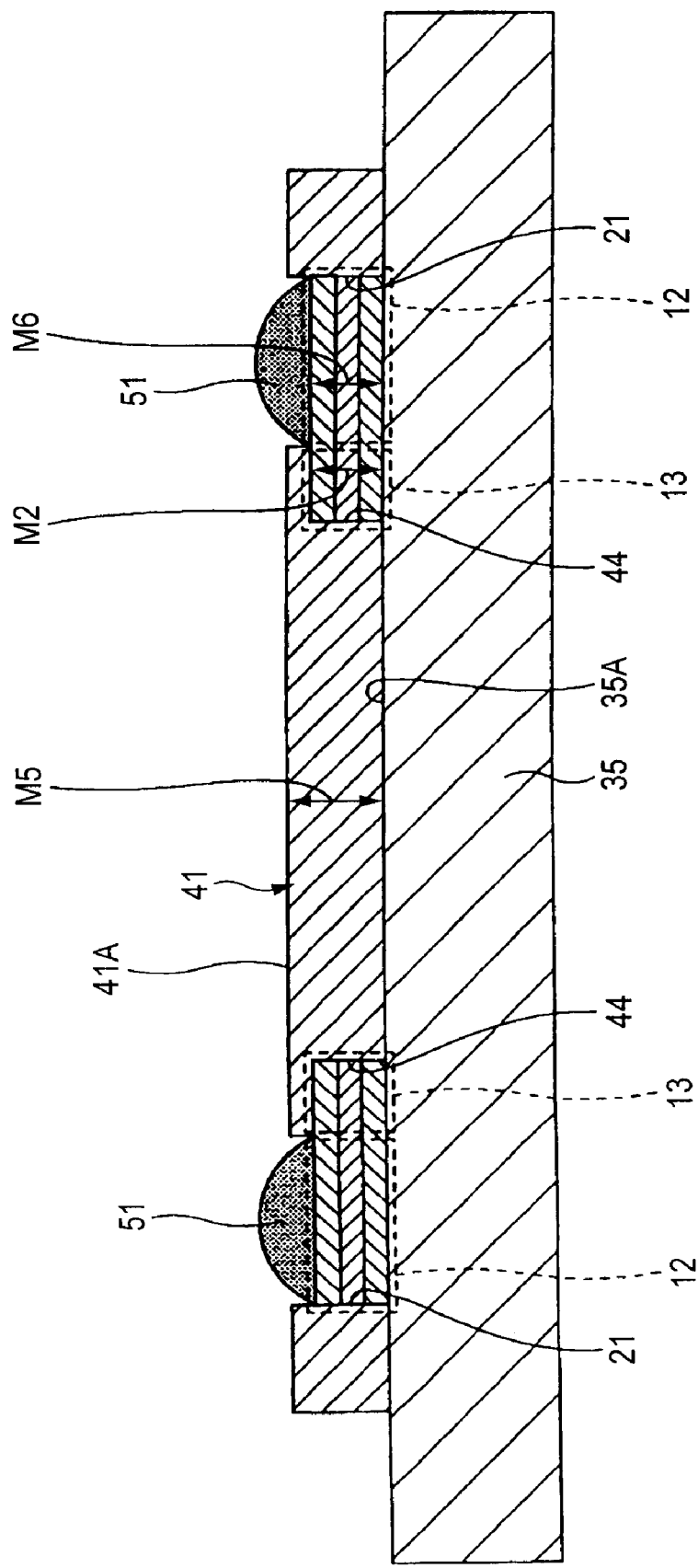
FIG. 22 is a view showing a first process step for fabricating the semiconductor device of the third exemplary embodiment of the present invention.
Figure 23:
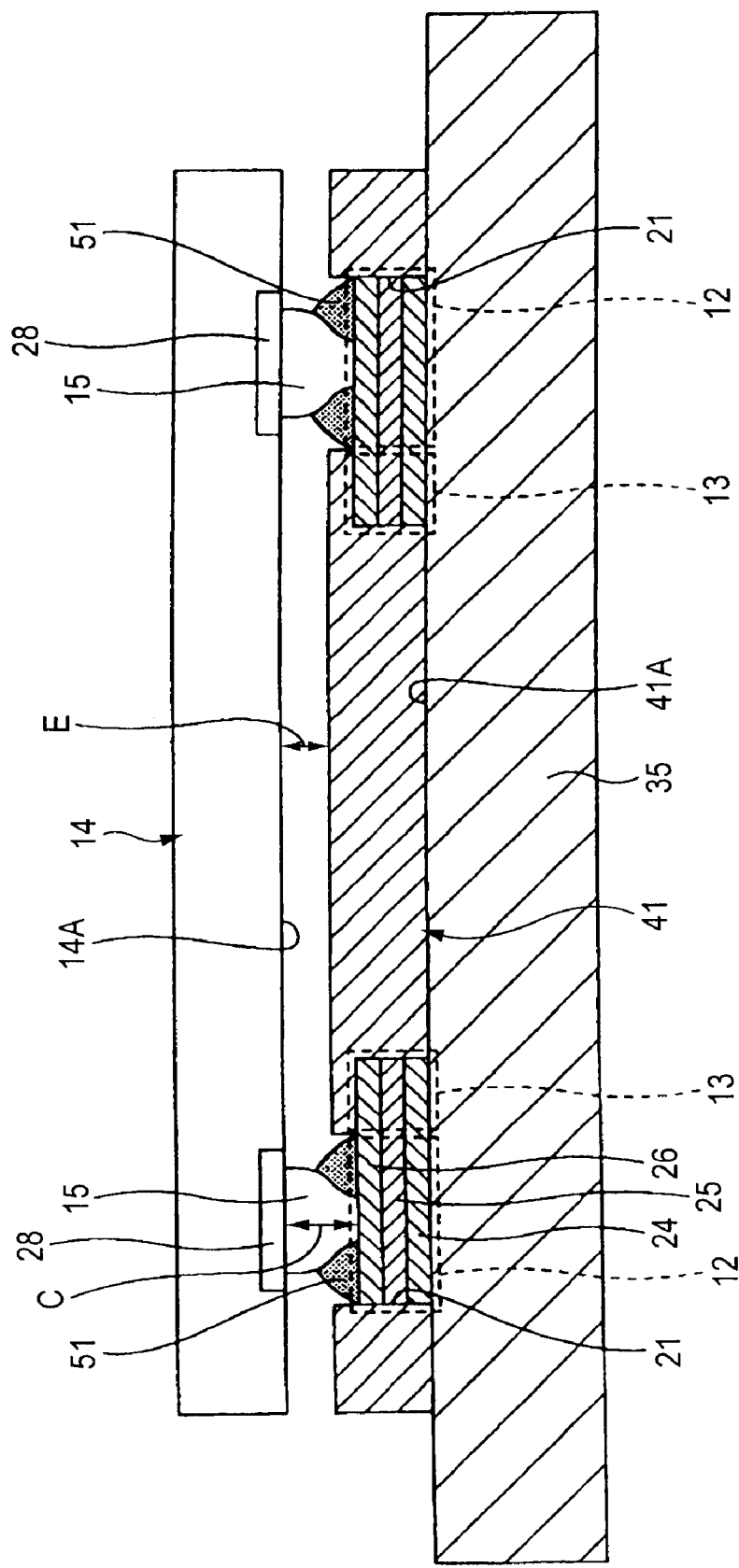
FIG. 23 is a view showing a second process step for fabricating the semiconductor device of the third exemplary embodiment of the present invention.

In the process shown in FIG. 22, the solder 51 is formed on the external connection pads 12 exposed from the low elastic resin member 41. Subsequently, in the process shown in FIG. 23, the internal connection terminal 15 is provided on each of the plurality of electrode pads 28 of the semiconductor chip 14. The lower end of the internal connection terminal 15 and the external connection pad 12 are brought into contact with each other while the structure shown in FIG. 22 is heated. Thus, the internal connection terminal 15 and the external connection pad 12 are connected to each other by the solder 51. As a result, the semiconductor chip 14 is bonded to the external connection pads 12 by flip-chip bonding. Distance E between the semiconductor chip 14 and the low elastic resin member 41 may be set to, e.g., 10 μm. Distance C between the electrode pad 28 and the external connection pad 12 may be set to, e.g., 35 μm.

Figure 24:
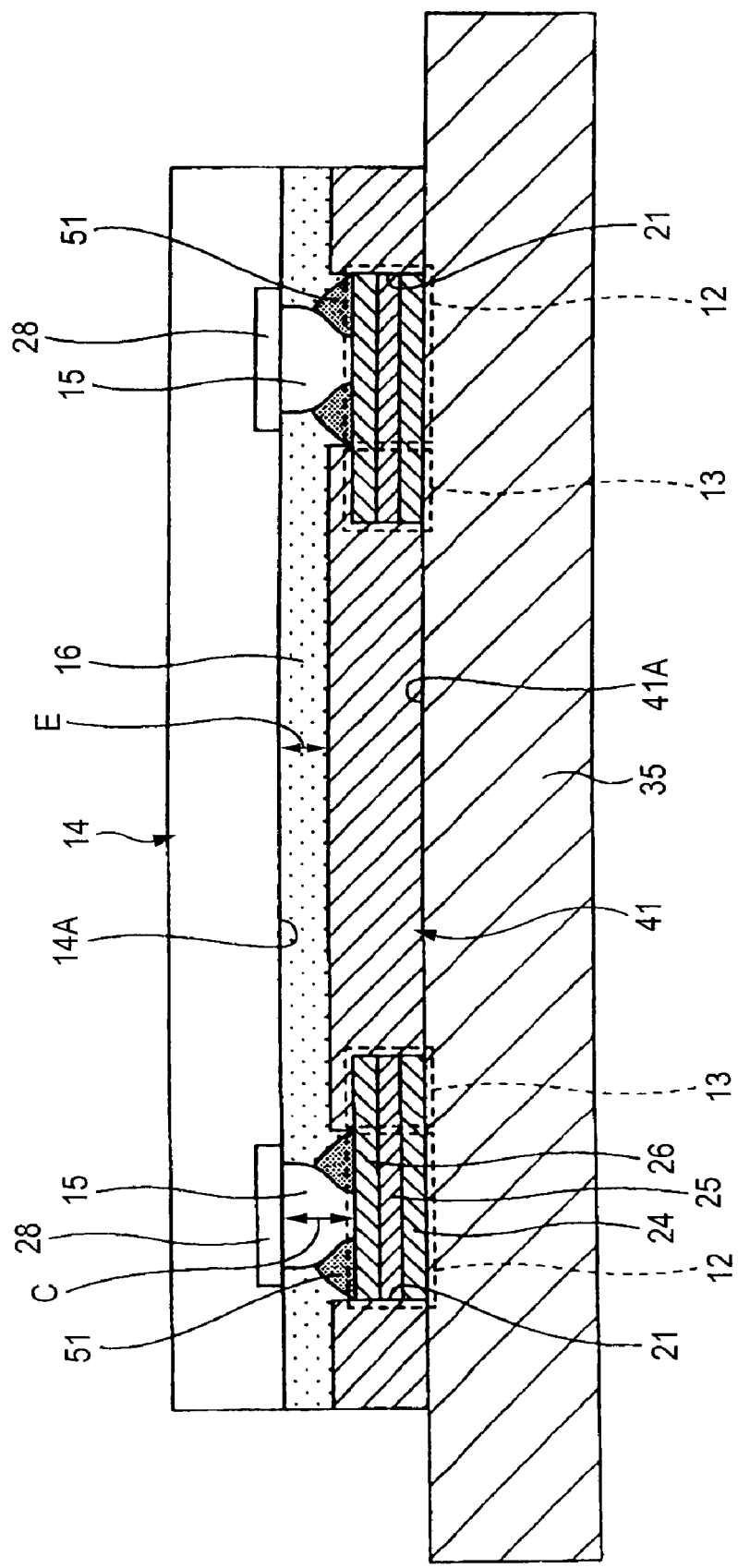
FIG. 24 is a view showing a third process step for fabricating the semiconductor device of the third exemplary embodiment of the present invention.

In the process shown in FIG. 24, the gap among the low elastic resin member 41, the solder 51 and the semiconductor chip 14 is filled with the underfill resin 16 by capillary action. According to the present embodiment, a paste-like anisotropic conductive resin [e.g., Anisotropic Conductive Paste (ACP)], a paste-like insulating resin [e.g., Non-Conductive Paste (NCP)] and the like, may be used as the underfill resin 16. In particular, an epoxy resin may be used as the underfill resin 16 and the elastic modulus may be in a range of several MPa.

Figure 25:
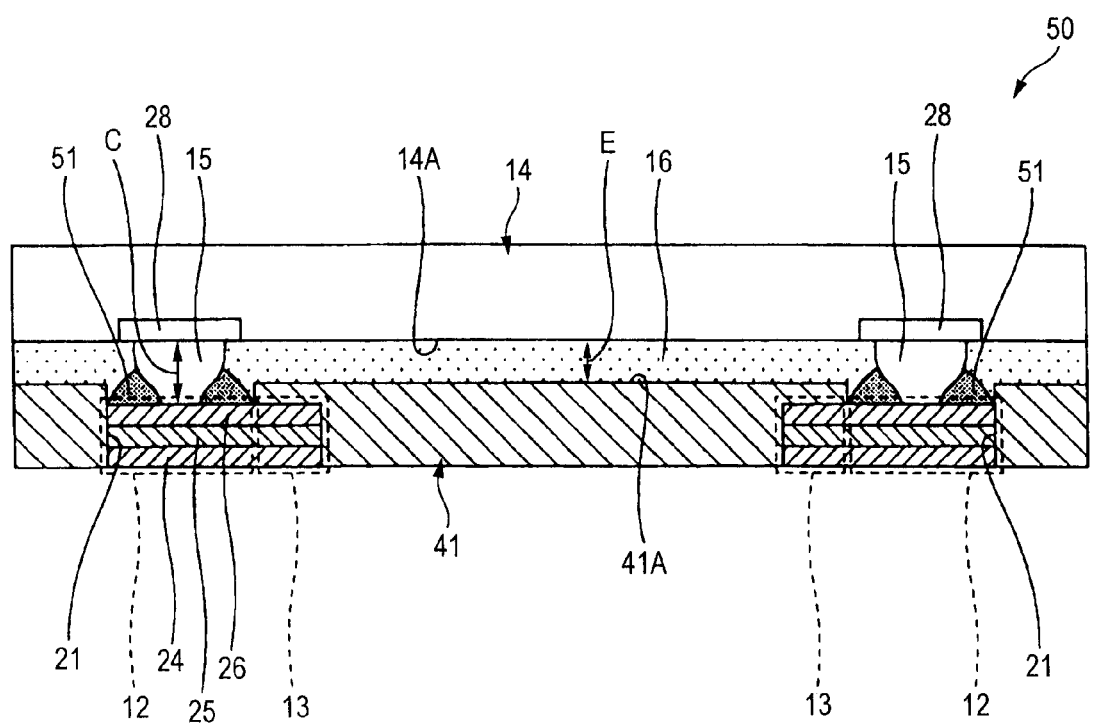
FIG. 25 is a view showing a fourth process step for fabricating the semiconductor device of the third exemplary embodiment of the present invention.

In a process shown in FIG. 25, the metal plate 35 is removed. Specifically, the metal plate 35 is removed by means of wet etching, for example. Thus, the semiconductor device 50 is fabricated.

Fourth Exemplary Embodiment

Figure 26:
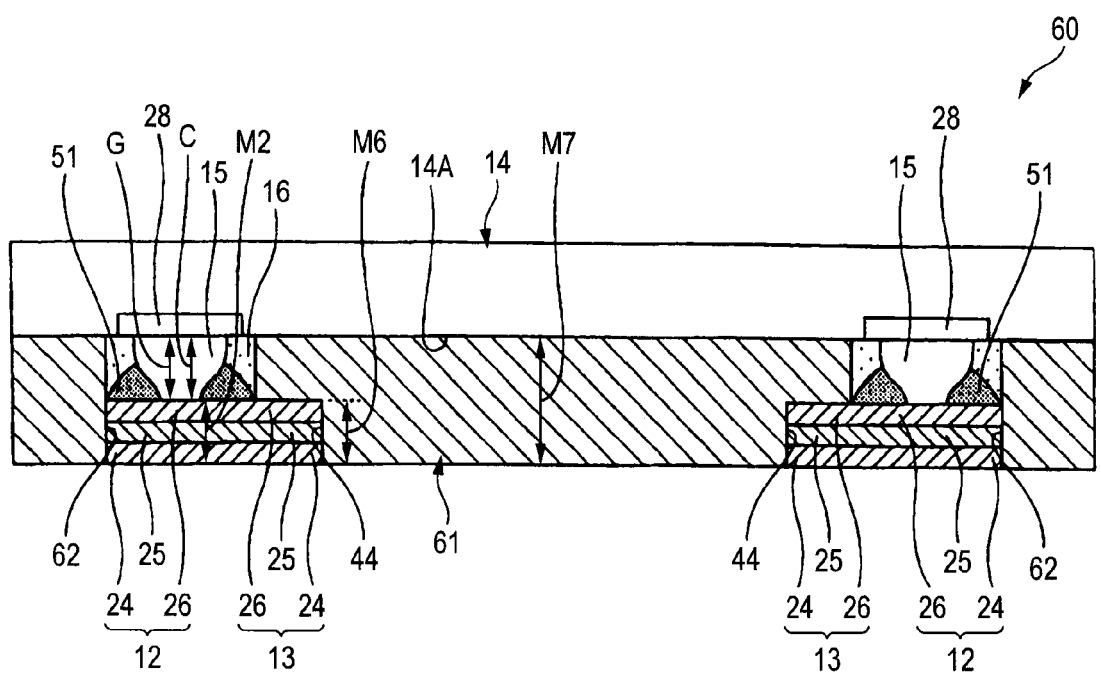
FIG. 26 is a cross sectional view of a semiconductor device of a fourth exemplary embodiment of the present invention.

FIG. 26 is a cross sectional view of a semiconductor device according to a fourth exemplary embodiment of the present invention. In FIG. 26, constituent elements which are the same as those of the semiconductor device 50 of the third exemplary embodiment are assigned the same reference numerals.

By reference to FIG. 26, a semiconductor device 60 of the fourth exemplary embodiment is formed in the same manner as the semiconductor device 50 except that a low elastic resin member 61 is provided instead of the low elastic resin member 41 provided in the semiconductor device 50 of the third exemplary embodiment and that the surface 14A of the semiconductor chip 14 is bonded to the upper surface of the low elastic resin member 61.

The low elastic resin member 61 is formed in the same manner as the low elastic resin member 41 except that the resin member 61 is made thicker than the thickness M5 of the low elastic resin member 41 described in connection with the third exemplary embodiment and that through parts 62, which are deeper than the through parts 21, are provided in place of the through parts 21 formed in the low elastic resin member 41.

The low elastic resin member 61 is a resin having an adhesive characteristic. The surface 14A of the semiconductor chip 14 is bonded to the low elastic resin member 61.

As mentioned above, the surface 14A of the semiconductor chip 14 is bonded to the low elastic resin member 61, thereby preventing provision of the underfill resin 16 between the surface 14A of the semiconductor chip 14 and the low elastic resin member 61. Accordingly, occurrence of warpage of the semiconductor device 60, which is caused by the underfill resin 16, can be prevented.

A resin having an elastic modulus of 0.1 MPa to 100 MPa may be used as a resin that serve as a base material of the low elastic resin member 61. Specifically, an epoxy resin, an urethane resin and a silicone resin, which have an elastic modulus of 0.1 MPa to 100 MPa (More preferably, 0.1 MPa to 10 MPa), can be used. The thickness M7 of the low elastic resin member 61 can be set to, e.g., 45µm.

The through parts 62 are formed in the low elastic resin member 61 so as to expose the external connection pads 12. A depth G of a portion of the through part 62 located above the external connection pad 12 is essentially equal to the distance C between the electrode pad 28 and the external connection pad 12. The through part 62 is used for housing the internal connection terminal 15 and positioning the underfill resin 16 and the solder 51.

According to the semiconductor device of the present embodiment, the surface 14A of the semiconductor chip 14 is bonded to the lower elastic resin member 61, thereby preventing provision of the underfill resin 16 between the surface 14A of the semiconductor chip 14 and the low elastic resin member 61. Hence, occurrence of warpage of the semiconductor device 60, which is caused by the underfill resin 16, can be prevented.

FIGS. 27 to 31 are views showing processes for fabricating the semiconductor device of the fourth exemplary embodiment of the present invention. In FIGS. 27 to 31, constituent elements which are the same as those of the semiconductor device 60 of the fourth exemplary embodiment are assigned the same reference numerals.

By reference FIGS. 27 to 31, the method for manufacturing the semiconductor device 60 of the fourth exemplary embodiment of the present invention will be described.

Figure 27:
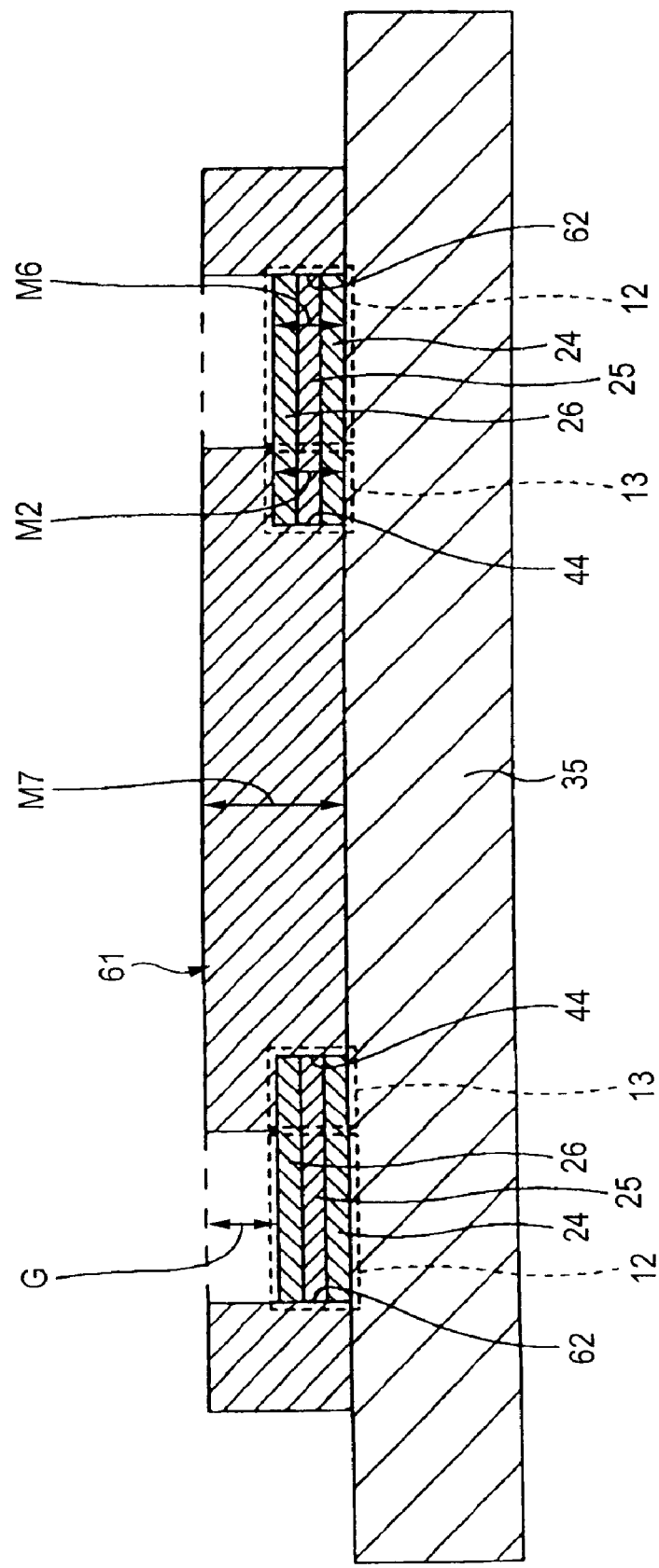
FIG. 27 is a view showing a first process step for fabricating the semiconductor device of the fourth exemplary embodiment of the present invention.

First, in a process shown in FIG. 27, the same processes as those shown in FIGS. 16 to 19 described in connection with the second exemplary embodiment is performed. The external connection pads 12, the wiring 13 and the low elastic resin member 61 are formed on the metal plate 35. The depth M2 of the external connection pad 12 and the thickness M6 of the wiring 13 may be set to, e.g., 10 µm.

A resin having an adhesive characteristic and an elastic modulus of 0.1 MPa to 100 MPa may be used as a resin that serves as a base material of the low elastic resin member 61. Specifically, an epoxy resin, an urethane resin and a silicone resin, which have an elastic modulus of 0.1 MPa to 100 MPa respectively, may be used. The thickness M7 of the low elastic resin member 61 may be set to, e.g., 45 µm. Moreover, the depth G of a portion of the through part 62 located above the external connection pad 12 may be set to, e.g., 35 µm.

Figure 28:
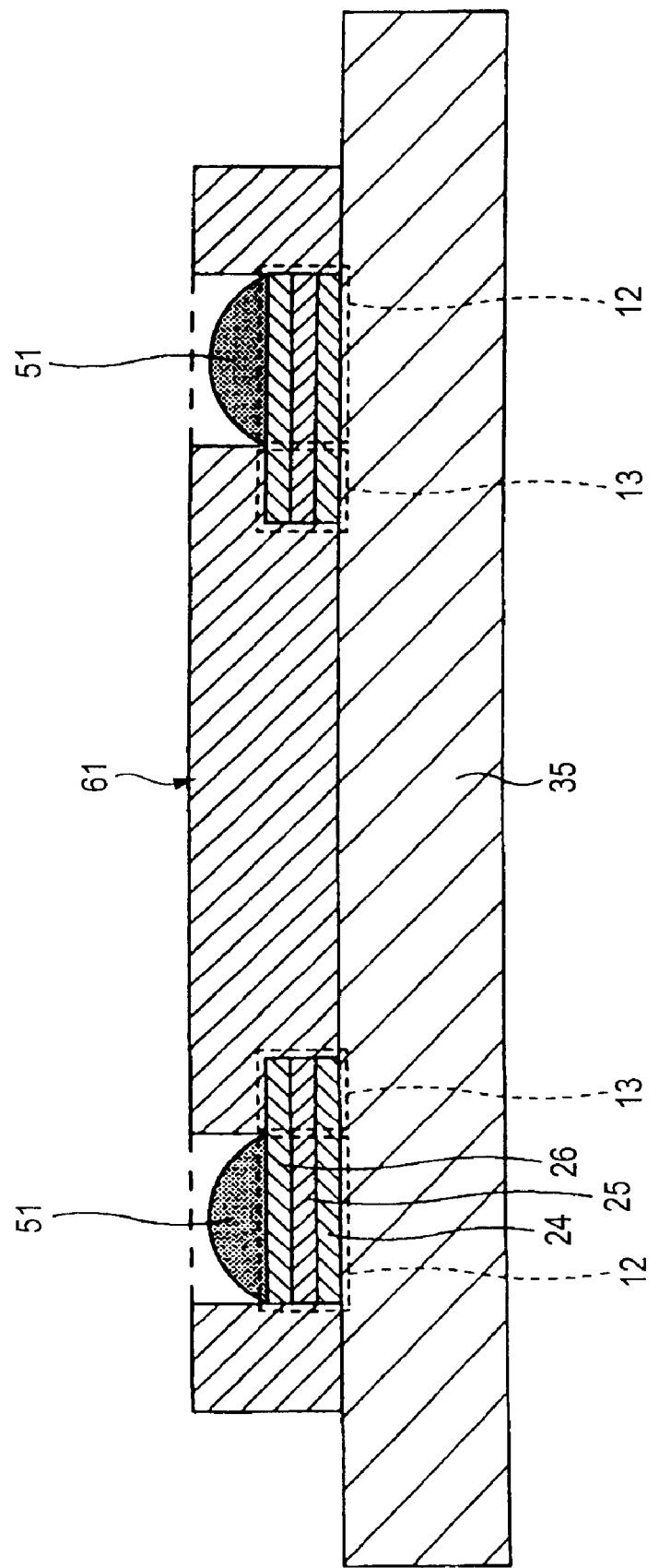
FIG. 28 is a view showing a second process step for fabricating the semiconductor device of the fourth exemplary embodiment of the present invention.

Next, in a process shown in FIG. 28, the solder 51 is formed on the upper surface (the upper surface of the third metal layer 26) of the external connection pad 12.

Figure 29:
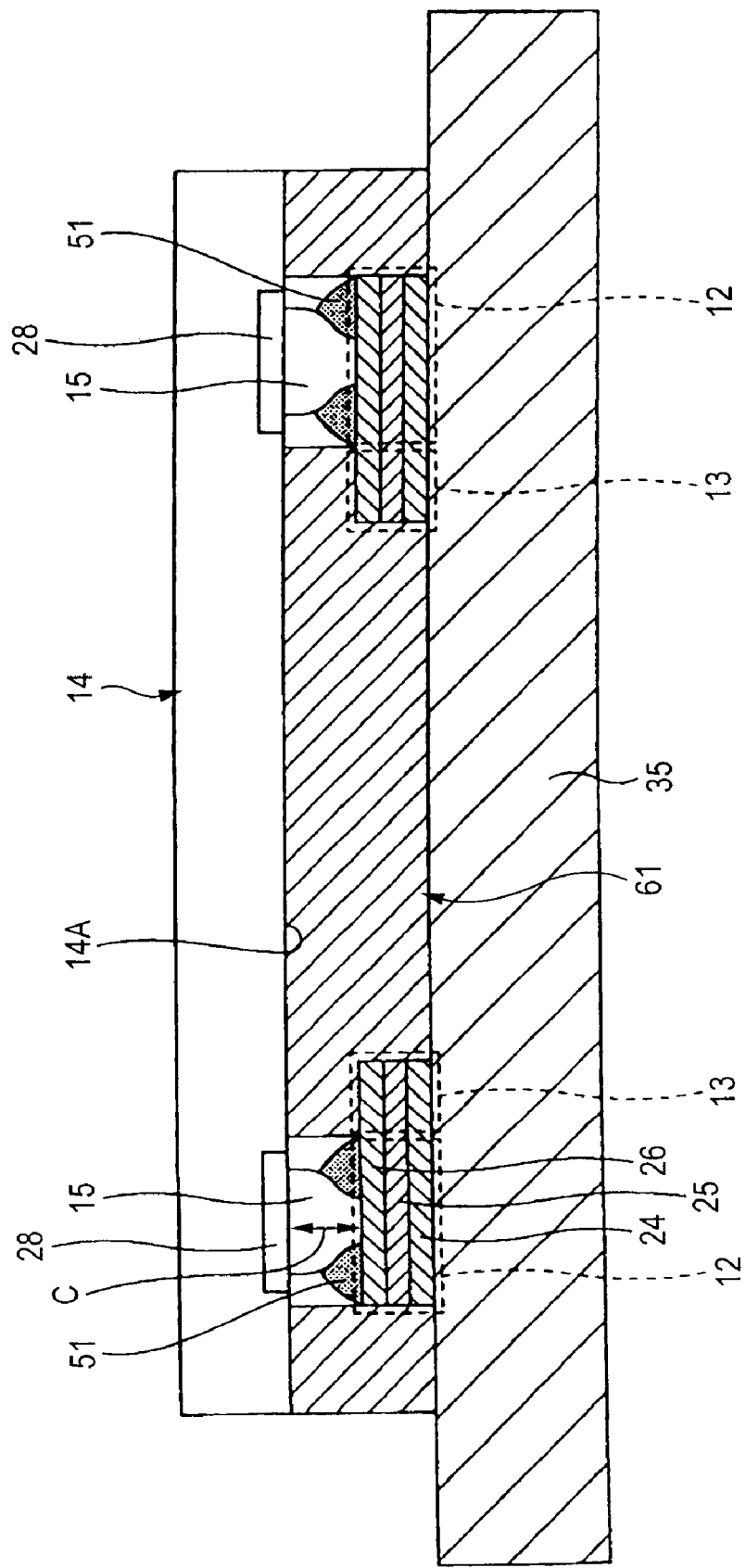
FIG. 29 is a view showing a third process step for fabricating the semiconductor device of the fourth exemplary embodiment of the present invention.

In a process shown in FIG. 29, the internal connection terminal 15 is provided on each of the plurality of electrode pads 28 of the semiconductor chip 14. The surface 14A of the semiconductor chip 14 is brought into contact with the low elastic resin member 61 while the structure shown in FIG. 28 is heated, and the semiconductor chip 14 is bonded to the low elastic resin member 61. Further, the lower end of the internal connection terminal 15 is brought into contact with the external connection pad 12, thereby connecting the internal connection terminal 15 with the external connection pad 12. As a result, the semiconductor chip 14 is bonded to the external connection pads 12 by flip-chip bonding. The distance C between the electrode pads 28 and the external connection pads 12 may be set to, e.g., 35 µm.

Figure 30:
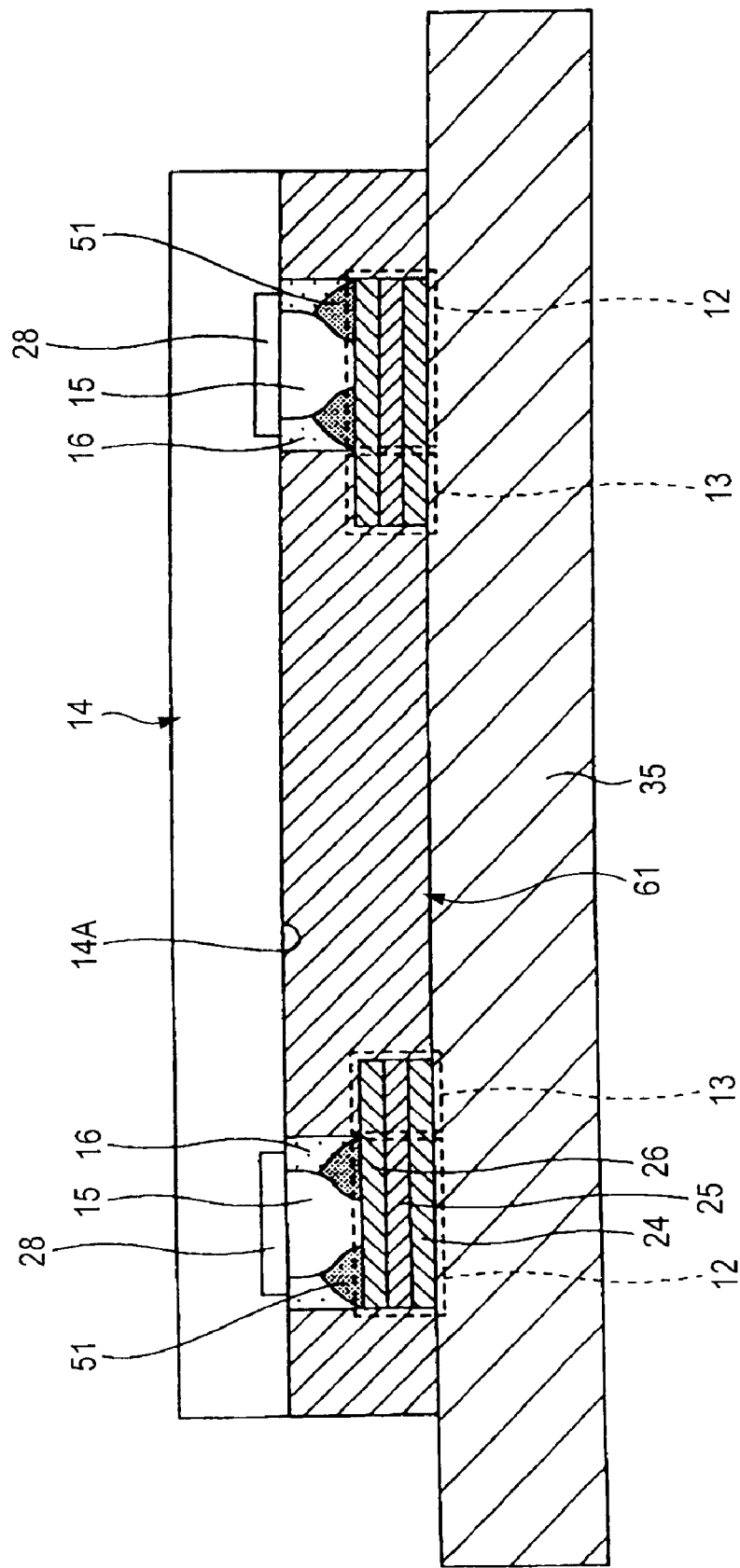
FIG. 30 is a view showing a fourth process step for fabricating the semiconductor device of the fourth exemplary embodiment of the present invention.

Next, in a process shown in FIG. 30, the underfill resin 16 is filled into the gap between the semiconductor chip 14 and the solder 51 by capillary phenomenon. According to the present embodiment, a paste-like anisotropic conductive resin [e.g., Anisotropic Conductive Paste (ACP)], a paste-like insulating resin [e.g., Non-Conductive Paste (NCP)], and the like, may be used as the underfill resin 16.

Figure 31:
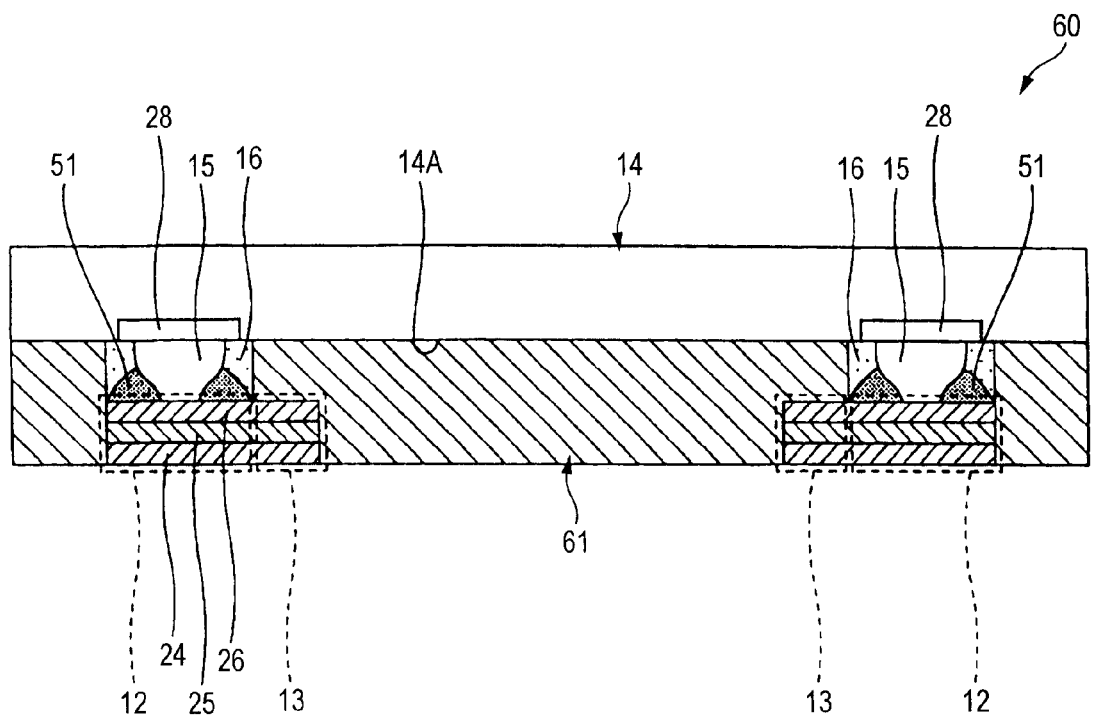
FIG. 31 is a view showing a fifth process step for fabricating the semiconductor device of the fourth exemplary embodiment of the present invention.

In a process shown in FIG. 31, the metal plate 35 is removed. Specifically, the metal plate 35 is removed by means of wet etching, for example. As a result, the semiconductor device 60 is fabricated.

Fifth Exemplary Embodiment

Figure 32:
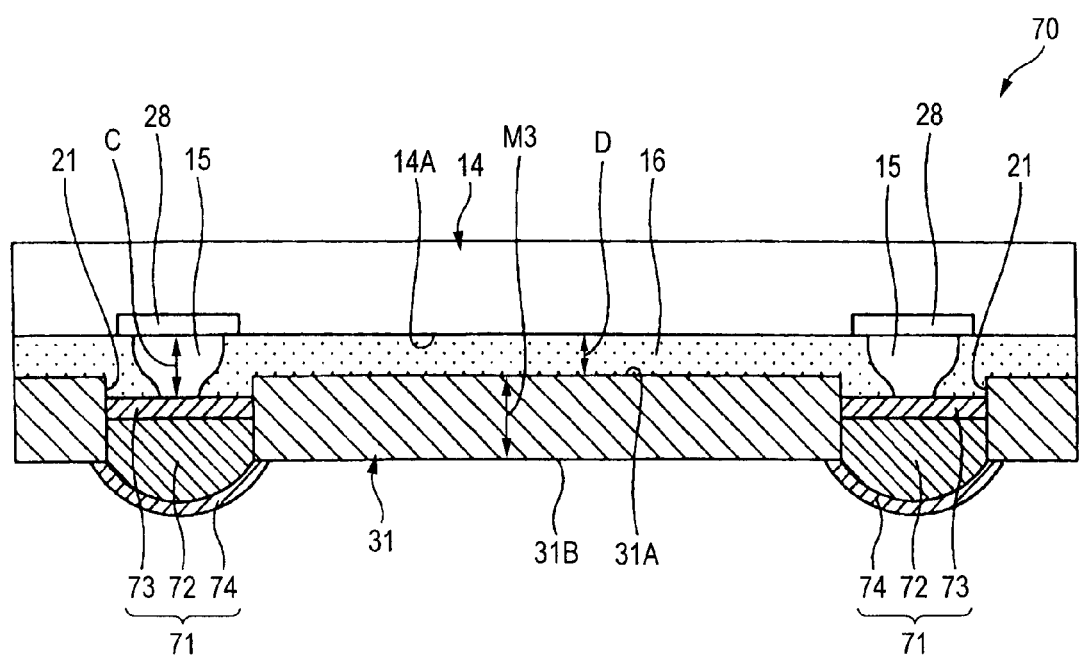
FIG. 32 is a cross sectional view of a semiconductor device of a fifth exemplary embodiment of the present invention.

FIG. 32 is a cross sectional view of a semiconductor device according to a fifth exemplary embodiment of the present invention. In FIG. 32, constituent elements which are the same as those of the semiconductor device 30 of the first exemplary embodiment are assigned the same reference numerals.

By reference to FIG. 32, a semiconductor device 70 of the fifth exemplary embodiment is formed in the same manner as the semiconductor device 30 except that external connection terminals 71 are provided instead of the external connection pads 12 provided in the semiconductor device 30 of the modification of the first exemplary embodiment.

The external connection terminal 71 includes a metal film 72 and metal layers 73 and 74. The metal film 72 is provided on each of the through parts 21. The upper surface of the metal film 72 is provided at a position lower than the upper surface 31A of the low elastic resin member 31. The lower end of the metal film 72 protrudes from a lower surface 31B of the low elastic resin member 31. For example, a Cu film may be used as the metal film 72. The thickness of the metal film 72 may be set to, e.g., 20 µm.

The metal layer 73 is provided so as to cover the upper surface of the metal film 72. An upper surface of the metal layer 73 is located at a position which is lower than the upper surface 31A of the low elastic resin member 31. For instance, an Au layer can be used as the metal layer 73. The thickness of the metal layer 73 can be set to: e.g., 0.5 µm.

The metal layer 74 is provided so as to cover a portion of the metal film 72 projecting from the lower surface 31B of the low elastic resin member 31. For example, an Au layer may be used as the metal layer 74. The thickness of the metal layer 74 may be set to, e.g., 0.5 μm.

The external connection terminals 71 configured as mentioned above are terminals for establishing a connection with pads provided on a mounting board such as a mother board.

As the semiconductor device 70 of the present embodiment, even a semiconductor device having the external connection terminals 71 in place of the external connection pads 12 can also obtain the same advantage as the semiconductor device 10 of the first exemplary embodiment.

FIGS. 33 to 36 are views showing processes for fabricating the semiconductor device of the fifth exemplary embodiment of the present invention. In FIGS. 33 to 36, constituent elements which are the same as those of the semiconductor device 70 of the fifth exemplary embodiment are assigned the same reference numerals.

Figure 33:
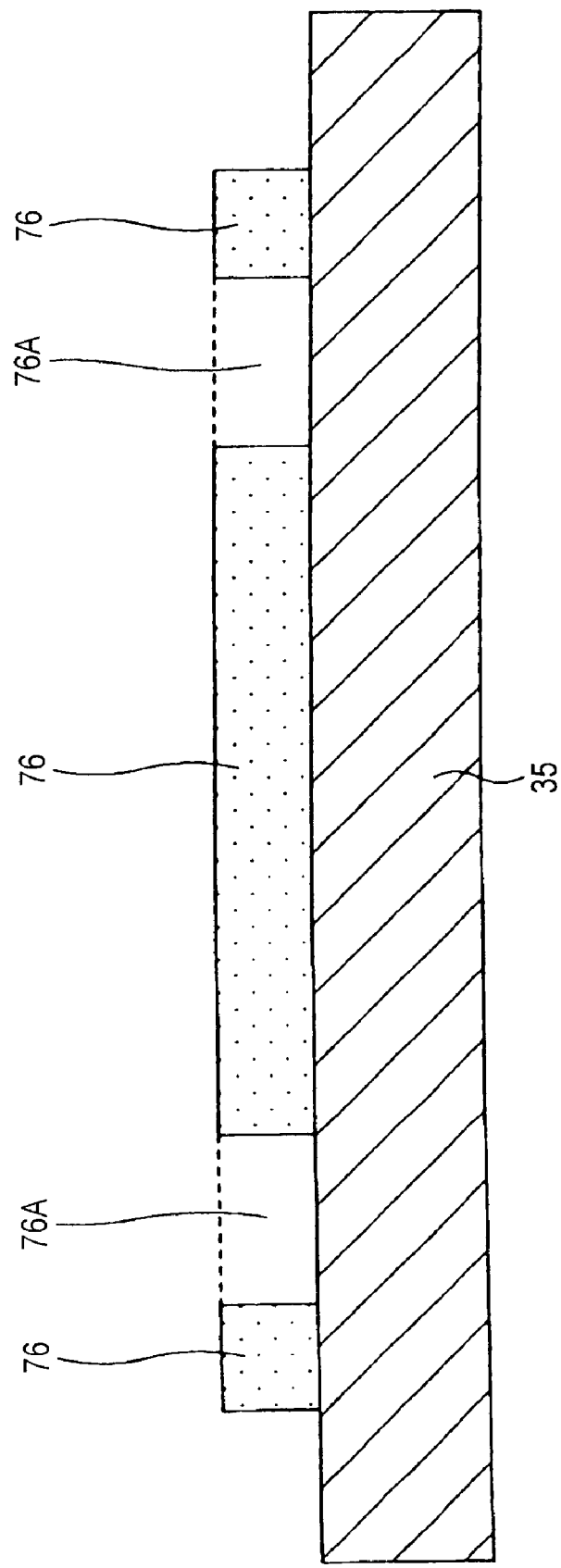
FIG. 33 is a view showing a first process step for fabricating the semiconductor device of the fifth exemplary embodiment of the present invention.

First, in a process shown in FIG. 33, a resist film 76 having an opening section 76A is formed over the metal plate 35 descried in connection with the process shown in FIG. 8 of the first exemplary embodiment.

Figure 34:
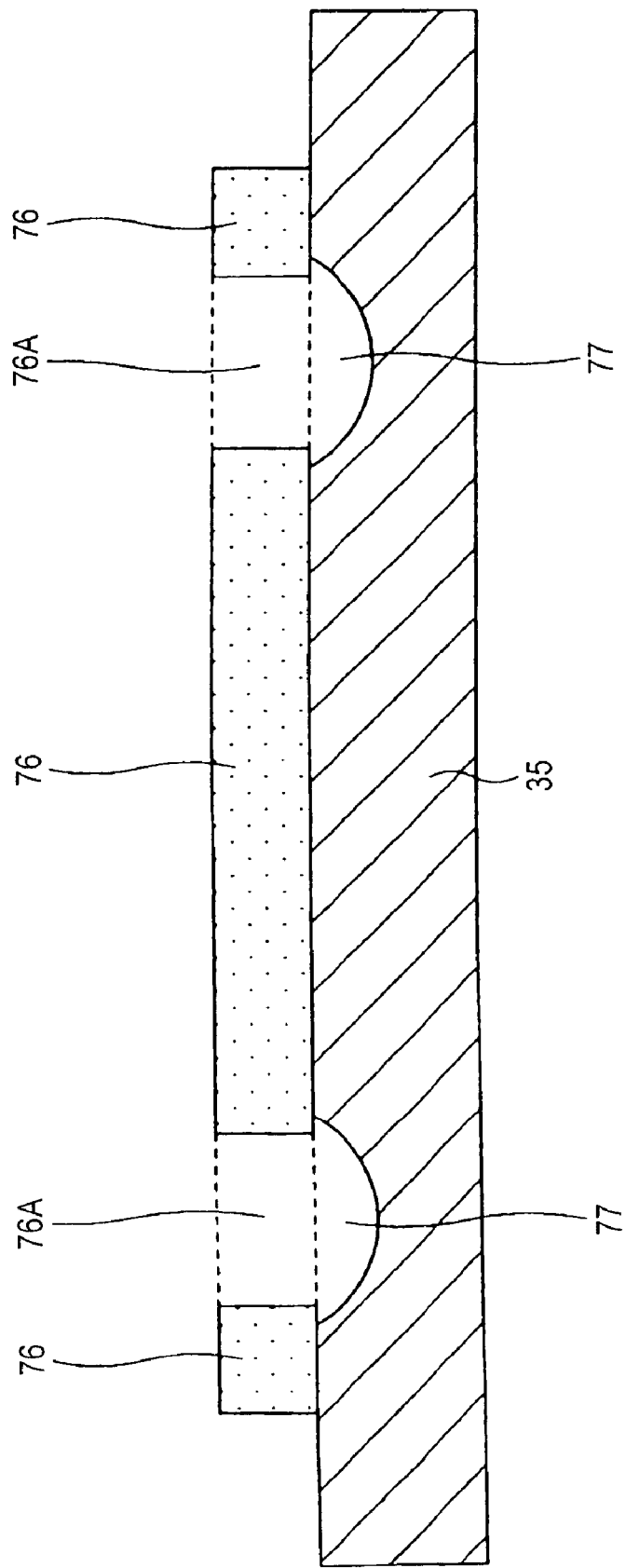
FIG. 34 is a view showing a second process step for fabricating the semiconductor device of the fifth exemplary embodiment of the present invention.

Subsequently, in a process shown in FIG. 34, concave portion 77 are formed in the metal plate 35 by means of wet etching in which the resist film 76 is used as a mask.

Figure 35:
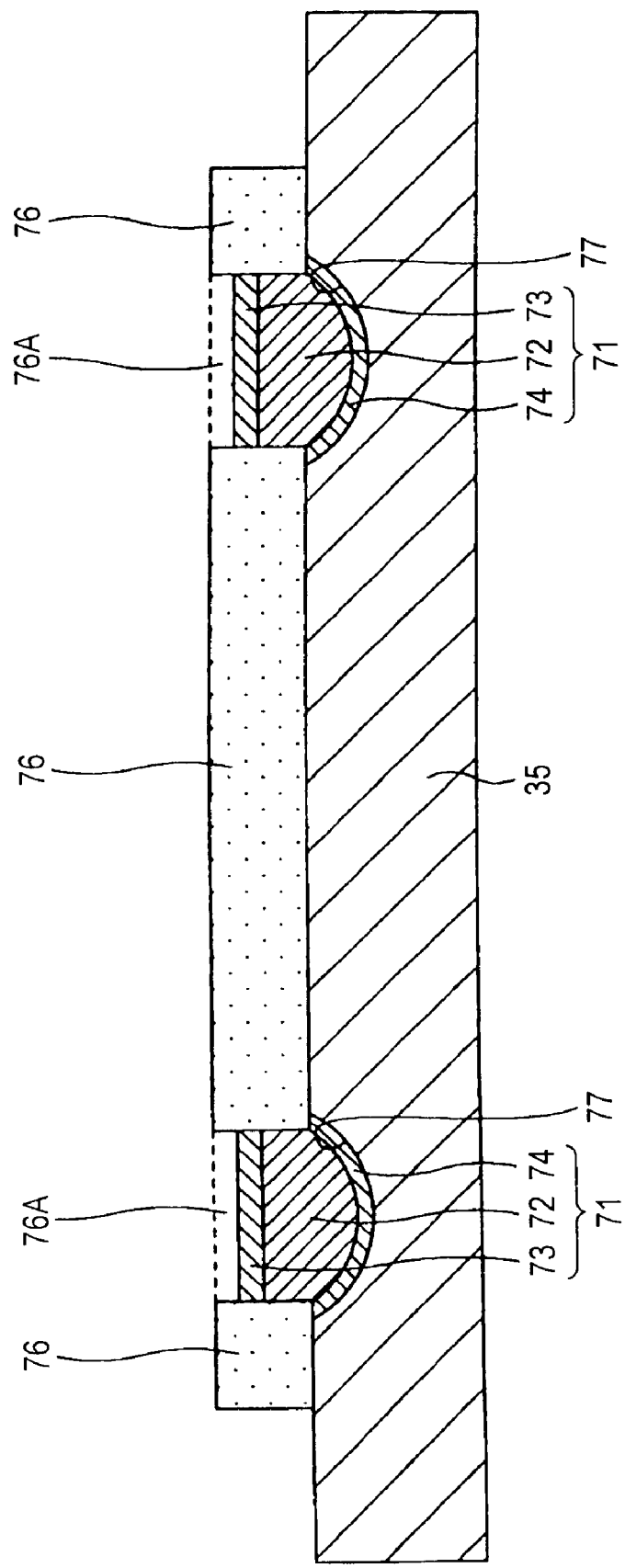
FIG. 35 is a view showing a third process step for fabricating the semiconductor device of the fifth exemplary embodiment of the present invention.

In a process shown in FIG. 35, a metal layer 73, a metal layer 72 and a metal layer 74 are successively formed on areas of the metal plate 35 that corresponds to the concave portion 77 and is taken as a feeding layer, by means of electrolytic plating. Thus, the external connection terminal 71 is formed of the metal film 72 and the metal layers 73 and 74.

For instance, a Cu film may be used as the metal film 72. The thickness of the metal film 72 may be set to, e.g., 20 μm. For example, an Au layer may be used as the metal layer 73. The thickness of the metal layer 73 may be set to, e.g., 0.5 μm. For instance, an Au layer may be used as the metal layer 74. The thickness of the metal layer 74 may be set to, e.g., 0.5 μm.

The resist film 76 is removed in a process shown in FIG. 36. Subsequently, the same processes as those shown in FIGS. 19 to 21 described in connection with the second exemplary embodiment are performed. Thus, the semiconductor device 70 is fabricated.

While a preferred embodiment of the present invention has been described, the present invention is not limited to these specific embodiments and is susceptible to various modifications or alterations within the scope of the present invention.

The present disclosure can be applied to a semiconductor device having a semiconductor chip bonded to external connection pads or external connection terminals by flip-chip bonding and an underfill resin.

What is claimed is:

1. A semiconductor device comprising:
a semiconductor chip having a plurality of electrode pads;
internal connection terminals provided on the plurality of electrode pads;
external connection pads electrically connected to the electrode pads through the internal connection terminals;
a low elastic resin member disposed opposite to a surface of the semiconductor chip on which the plurality of electrode pads are formed; and
an underfill resin filled between the semiconductor chip and the low elastic resin member and between the electrode pads and the external connection pads,
wherein the underfill resin spaces the semiconductor chip at a distance from the low elastic resin member such that the semiconductor chip is not disposed directly on a surface of the low elastic resin member,
wherein the low elastic resin member has a lower elastic modulus than the underfill resin,
wherein the low elastic resin member has a plurality of through holes therethrough, and each of the external connection pads is disposed in a corresponding one of the through holes, and
wherein a lower surface of the external connection pads are substantially flush with a lower surface of the low elastic resin member.

2. The semiconductor device according to claim 1, wherein first distance between the semiconductor chip and the low elastic resin member is narrower than second distance between the electrode pads and the external connection pads.

3. The semiconductor device according to claim 1, wherein an elastic modulus of the low elastic resin member is in range of 0.1 MPa to 100 MPa.

4. The semiconductor device according to claim 1, wherein the external connection pads are provided on the low elastic resin member; and the low elastic resin member exposes surfaces of external connection pads to which the inner connection terminals are connected.

5. The semiconductor device according to claim 1, wherein the low elastic resin member is provided with a wiring for establishing an electrical connection among the plurality of external connection pads.

6. The semiconductor device according to claim 5, wherein a surface of the wiring opposite to the semiconductor chip is covered with the low elastic resin member.

7. A semiconductor device comprising:
a semiconductor chip having a plurality of electrode pads;
internal connection terminals provided on the plurality of electrode pads;
external connection pads electrically connected to the electrode pads through the internal connection terminals;
a low elastic resin member provided on a surface of the semiconductor chip on which the plurality of electrode pads are formed; and
an underfill resin filled between the electrode pads and the external connection pads,
wherein the low elastic resin member has a lower elastic modulus than the underfill resin,
wherein the low elastic resin member has a plurality of through holes therethrough, and each of the external connection pads is disposed in a corresponding one of the through holes, and
wherein a lower surface of the external connection pads are substantially flush with a lower surface of the low elastic resin member.

8. The semiconductor device according to claim 7, wherein the external connection pads are provided on the low elastic resin member; and surfaces of the external connection pads to which the inner connection terminals are connected are exposed from the low elastic resin member.

9. The semiconductor device according to claim 7, wherein the low elastic resin member is provided with a wiring for establishing an electrical connection among the plurality of external connection pads.

10. The semiconductor device according to claim 9, wherein a surface of the wiring opposite to the semiconductor chip is covered with the low elastic resin member.

11. The semiconductor device according to claim 7, wherein the elastic modulus of the low elastic resin member is in a range of 0.1 MPa to 10 MPa.

* * * * *